(12) United States Patent
Den Boef et al.

(10) Patent No.: US 7,112,813 B2
(45) Date of Patent: Sep. 26, 2006

(54) DEVICE INSPECTION METHOD AND APPARATUS USING AN ASYMMETRIC MARKER

(75) Inventors: Arie Jeffrey Den Boef, Waarle (NL); Frank Bornebroek, Eindhoven (NL); Hugo Augustinus Joseph Cramer, Eindhoven (NL); Mircea Dusa, Campbell, CA (US); Richard Johannes Franciscus Van Haren, Veldhoven (NL); Antoine Gaston Marie Kiers, Veldhoven (NL); Justin Lloyd Kreuzer, Trumbull, CT (US); Maurits Van Der Schaar, Veldhoven (NL); Paul Jacques Van Wijnen, Veldhoven (NL); Everhardus Cornelis Mos, Eindhoven (NL); Pieter Willem Herman De Jager, Rotterdam (NL); Hans Van Der Laan, Veldhoven (NL); Paul Frank Luehrmann, Santa FE, NM (US)

(73) Assignee: ASML Netherlands B.V., Veldhoven (NL)

( * ) Notice: Subject to any disclaimer, the term of this patent is extended or adjusted under 35 U.S.C. 154(b) by 178 days.

(21) Appl. No.: 10/665,720

(22) Filed: Sep. 22, 2003

(65) Prior Publication Data

US 2004/0129900 A1 Jul. 8, 2004

Related U.S. Application Data

(60) Provisional application No. 60/413,601, filed on Sep. 26, 2002, provisional application No. 60/411,861, filed on Sep. 20, 2002.

(30) Foreign Application Priority Data

Apr. 1, 2003 (EP) .................................. 03075954

May 12, 2003 (EP) .................................. 03076422

(51) Int. Cl.
G01N 21/86 (2006.01)

(52) U.S. Cl. .................... 250/559.3; 250/548
(58) Field of Classification Search ............. 250/559.3, 250/548

See application file for complete search history.

(56) References Cited

U.S. PATENT DOCUMENTS 4,037,969 A 7/1977 Feldman et al.

(Continued)

FOREIGN PATENT DOCUMENTS

DE 262 510 A1 11/1988

(Continued)

OTHER PUBLICATIONS

Markle, D. A., "Submicron 1:1 Optical Lithography", Semi-conductor International, pp. 173-142, May 1986.

Primary Examiner—Que T. Le
(74) Attorney, Agent, or Firm—Pillsbury Winthrop Shaw Pittman, LLP

(57) ABSTRACT

A method of device inspection, the method comprising providing an asymmetric marker on a device to be inspected, the form of asymmetry of the marker being dependent upon the parameter to be inspected, directing light at the marker, obtaining a first measurement of the position of the marker via detection of diffracted light of a particular wavelength or diffraction angle, obtaining a second measurement of the position of the marker via detection of diffracted light of a different wavelength or diffraction angle, and comparing the first and second measured positions to determine a shift indicative of the degree of asymmetry of the marker.

64 Claims, 14 Drawing Sheets

U.S. PATENT DOCUMENTS

| | | |
|---|---|---|
| 4,251,160 A | 2/1981 | Bouwhuis et al. |
| 4,326,805 A | 4/1982 | Feldman et al. |
| 4,355,892 A | 10/1982 | Mayer et al. |
| 4,398,824 A | 8/1983 | Feldman et al. |
| 4,514,858 A | 4/1985 | Novak |
| 4,540,277 A | 9/1985 | Mayer et al. |
| 4,614,432 A | 9/1986 | Kuniyoshi et al. |
| 4,690,529 A | 9/1987 | Sugiyama et al. |
| 4,710,026 A | 12/1987 | Magome et al. |
| 4,748,333 A | 5/1988 | Mizutani et al. |
| 4,778,275 A | 10/1988 | Van Den Brink et al. |
| 4,814,829 A | 3/1989 | Kosugi et al. |
| 4,828,392 A | 5/1989 | Nomura et al. |
| 4,857,744 A | 8/1989 | Kataoka et al. |
| 4,861,162 A | 8/1989 | Ina |
| 4,870,452 A | 9/1989 | Tanimoto et al. |
| 4,952,970 A | 8/1990 | Suzuki et al. |
| 5,047,651 A * | 9/1991 | Wessner et al. ............ 250/548 |
| 5,100,237 A | 3/1992 | Wittekoek et al. |
| 5,114,236 A | 5/1992 | Matsugu et al. |
| 5,118,953 A | 6/1992 | Ota et al. |
| 5,144,363 A | 9/1992 | Wittekoek et al. |
| 5,151,754 A | 9/1992 | Ishibashi et al. |
| 5,160,849 A | 11/1992 | Ota et al. |
| 5,243,195 A | 9/1993 | Nishi |
| 5,347,356 A | 9/1994 | Ota et al. |
| 5,418,613 A | 5/1995 | Matsutani |
| 5,477,057 A | 12/1995 | Angeley et al. |
| 5,488,230 A | 1/1996 | Mizutani et al. |
| 5,489,986 A | 2/1996 | Magome et al. |
| 5,543,921 A | 8/1996 | Uzawa et al. |
| 5,559,601 A | 9/1996 | Gallatin et al. |
| 5,596,204 A | 1/1997 | Irie et al. |
| 5,674,650 A | 10/1997 | Dirksen et al. |
| 5,801,390 A | 9/1998 | Shiraishi |
| 5,808,910 A | 9/1998 | Irie et al. |
| 5,910,847 A | 6/1999 | Van der Werf et al. |
| 5,920,376 A | 7/1999 | Bruckstein et al. |
| 5,920,378 A | 7/1999 | Murakami et al. |
| 6,034,378 A | 3/2000 | Shiraishi |
| 6,133,641 A | 10/2000 | Hamada et al. |
| 6,233,494 B1 | 5/2001 | Aoyagi |
| 6,242,754 B1 | 6/2001 | Shiraishi et al. |
| 6,297,876 B1 | 10/2001 | Bornebroek |
| 6,420,791 B1 | 7/2002 | Huang et al. |
| 6,937,344 B1 | 8/2005 | Monshouwer et al. |
| 2001/0026368 A1 | 10/2001 | Mikami |
| 2002/0021434 A1 | 2/2002 | Nomura et al. |
| 2002/0041373 A1 | 4/2002 | Littau et al. |
| 2002/0072003 A1 | 6/2002 | Brill et al. |
| 2002/0158193 A1 | 10/2002 | Sezginer et al. |
| 2003/0002043 A1 | 1/2003 | Abdulhalim et al. |

FOREIGN PATENT DOCUMENTS

| | | |
|---|---|---|
| JP | 3-257303 | 11/1991 |
| JP | 11-329914 | 11/1999 |
| WO | WO 02/065545 A2 | 8/2002 |

* cited by examiner

No Capture Error

Capture Error in y Direction

DEVICE INSPECTION METHOD AND APPARATUS USING AN ASYMMETRIC MARKER

RELATED APPLICATIONS

This application claims priority to U.S. Application No. 60/411,861, filed Sep. 20, 2002, and U.S. Application No. 60/413,601, filed Sep. 26, 2002, and also claims priority to European Patent Application No. 3075954.2, filed Apr. 1, 2003, and 3076422.9, filed May 12, 2003. The contents of all of which are incorporated herein by reference.

BACKGROUND OF THE INVENTION

1. Field of the Invention

The present invention relates to methods of inspection useable in the manufacture of devices by lithographic techniques and to device inspection apparatus.

2. Description of the Related Art

In a manufacturing process using a lithographic projection apparatus, a pattern (e.g., in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and inspection of the imaged features. This array of procedures is used as a basis to pattern an individual layer of a device, e.g., an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4, incorporated herein by reference.

The inspection step after development of the resist, commonly referred to as metrology, serves two purposes. Firstly, it is desirable to detect any target areas where the pattern in the developed resist is faulty. If a sufficient number of dies are faulty, the wafer can be stripped of the patterned resist and re-exposed, hopefully correctly, rather than making the fault permanent by carrying out a process step, e.g. an etch, with a faulty pattern. Secondly, the measurements may allow errors in the lithographic apparatus, e.g. in illumination settings or exposure times, to be detected and corrected for subsequent exposures.

A metrology measurement may be used to determine the overlay error between two layers of a wafer, or may be used to determine focus errors or the critical dimension (CD) of features of a particular layer of the wafer (usually the uppermost layer). There are a variety of ways in which the metrology measurement may be obtained. Typically, these are performed in an apparatus which is separate from the lithographic apparatus. Measurements performed in a separate apparatus are commonly referred to as off-line. A single off-line apparatus may be used to perform metrology measurements for wafers produced by several lithographic apparatus.

One known off-line metrology apparatus, used to measure overlay is based upon imaging of boxes printed on the wafer, a first box being printed on a first layer and a second box being printed on a second layer. This apparatus may also be used to measure focus errors. The apparatus is commonly referred to as box-in-box (or frame-in-frame). A disadvantage of the box-in-box apparatus is that its general accuracy is limited because it relies upon single line image detection.

A second known off-line metrology apparatus comprises a scanning electron microscope (SEM). This provides very high resolution measurements of the surface of a wafer, and is used for CD measurements. A disadvantage of this apparatus is that it is slow and expensive.

A third known off-line metrology apparatus is known as a scatterometer. This provides measurement of CD and/or overlay. In a scatterometer, white light is reflected by periodic structures in the developed resist and the resulting reflection spectrum at a given angle detected. The structure giving rise to the reflection spectrum is reconstructed, e.g. using Rigorous Coupled-Wave Analysis (RCWA) or by comparison to a library of spectra derived by simulation. However, the reconstruction of the structure is computationally very intensive and the technique can suffer from low sensitivity and poor repeatability.

SUMMARY OF THE INVENTION

It is an object of the present invention to provide device inspection which overcomes at least one of the above disadvantages.

According to the invention there is provided a method of device inspection, the method comprising providing an asymmetric marker on a device to be inspected, the form of asymmetry of the marker being dependent upon the parameter to be inspected, directing light at the marker, obtaining a first measurement of the position of the marker via detection of diffracted light of a particular wavelength or diffraction angle, obtaining a second measurement of the position of the marker via detection of diffracted light of a different wavelength or diffraction angle, and comparing the first and second measured positions to determine a shift indicative of the degree of asymmetry of the marker.

The first and second position measurements may comprise detection of diffracted light having different diffraction angles but the same wavelength. Alternatively, the first and second position measurements may comprise detection of diffracted light having the same diffraction angle but different wavelengths. In a further alternative, the first and second position measurements may comprise detection of diffracted light having different diffraction angles and different wavelengths.

The marker may comprise one or more diffraction gratings and the diffraction angles may comprise diffraction orders.

The marker may comprise a first diffraction grating provided in a first layer of the device, and a second diffraction grating provided in a second layer of the device, the first diffraction grating and the second diffraction grating having the same period and being provided one over the other such that the light is diffracted by both of the diffraction gratings in combination.

The marker may comprise a first diffraction grating provided in a first layer of the device, and a second diffraction grating provided in a second lower layer of the device, the first diffraction grating and the second diffraction grating having different periods each selected to give rise to strong diffraction at different diffraction orders, such that a measurement of the position of the first diffraction grating is provided by measuring one diffraction order and a measurement of the position of the second diffraction grating is provided by measuring the other diffraction order, the shift indicating the overlay of the first and second layers.

The term 'strong diffraction' is intended to mean that the diffraction is sufficiently strong to be measured, and is preferably stronger than diffraction from both of the diffraction gratings in combination.

The marker may comprise one phase diffraction grating arranged to measure the focus accuracy of a lithographic projection apparatus, the method comprising providing on a mask of the lithographic projection apparatus a phase diffraction grating having a substructure which includes a step in optical path length of substantially $$\frac{\lambda}{4},$$

the step being in opposite directions for adjacent lines of the diffraction grating, the period of the substructure being selected such that a focus error will cause the phase diffraction grating to shift when projected onto the device by the lithographic apparatus, adjacent lines of the phase diffraction grating being shifted in opposite directions giving rise to an asymmetry which is measured by the shift.

The marker may comprise one diffraction grating arranged to measure the critical dimension of a pattern exposed on a wafer in the lithographic projection apparatus, the method comprising imaging onto a wafer a diffraction grating having a substructure with a period at, or of the order of, the critical dimension capable of being imaged by the lithographic projection apparatus, the substructure being arranged to form an additional line of the diffraction grating which renders the diffraction grating asymmetric, changes of the critical dimension modifying the effective reflectivity of the substructure thereby modifying the asymmetry of the diffraction grating, the modified asymmetry being detected as the shift.

The invention also provides a device inspection apparatus, the apparatus comprising a light source arranged to direct light at an asymmetric marker provided on a device, a detector arranged to detect light diffracted from the marker with a particular wavelength or diffraction angle thereby providing a measurement of the position of the marker, a second detector arranged to detect light diffracted from the marker with a different wavelength or diffraction angle thereby providing a second measurement of the position of the marker, and comparison means arranged to compare the measured positions to determine a shift.

The invention also provides a device inspection apparatus, the apparatus comprising a light source arranged to direct light at a phase diffraction grating provided on a device, a detector arranged to detect light diffracted from the phase diffraction grating, and processing means arranged to obtain inspection information using the detected diffracted light.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "light", "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
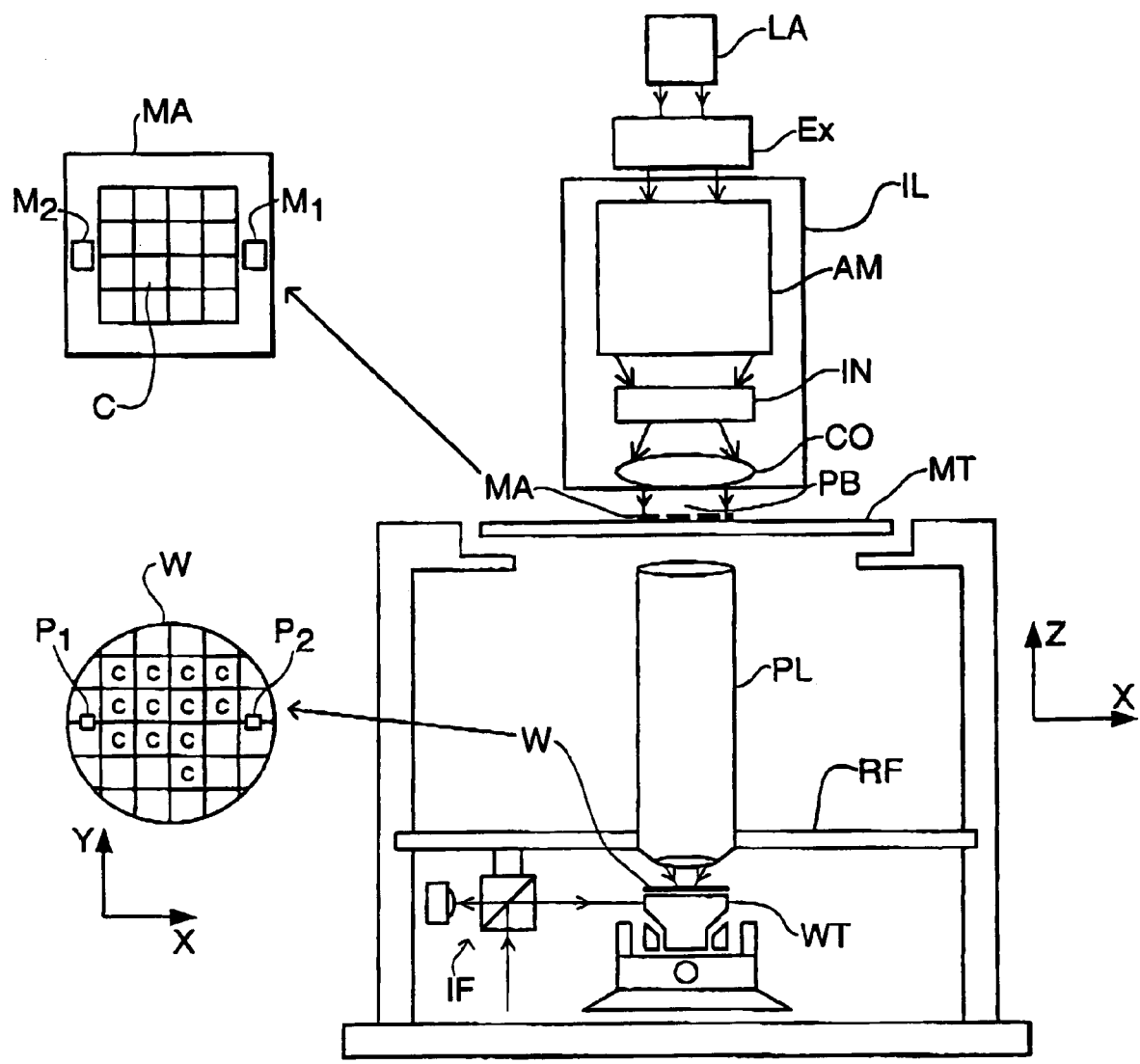
FIG. 1 depicts schematically a lithographic projection apparatus which may be used in the manufacture of devices that may be inspected using the invention.

FIG. 1 schematically depicts a lithographic projection apparatus useable in methods according to the invention. The apparatus comprises:

a radiation system Ex, for supplying a beam PB of radiation (e.g., DUV radiation), which in this particular case also comprises a radiation source LA;

a first object table (mask table) MT provided with a mask holder for holding a mask MA (e.g., a reticle), and connected to first positioning device for accurately positioning the mask with respect to a projection system ("lens") PL;

a second object table (substrate table) WT provided with a substrate holder for holding a substrate W (e.g., a resist-coated silicon wafer), and connected to second positioning device for accurately positioning the substrate with respect to projection system PL;

the projection system ("lens") PL (e.g., a refractive lens system) for imaging an irradiated portion of the mask MA onto a target portion C (e.g., comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning means, such as a programmable mirror array of a type as referred to above.

The source LA (e.g., an excimer laser) produces radiation. This radiation is fed into an illumination system (illuminator) IL, either directly or after having traversed a conditioning device, such as a beam expander Ex, for example. The illuminator IL may comprise an adjusting device AM for setting the outer and/or inner radial extent (commonly referred to as .sigma.-outer and .sigma.-inner, respectively) of the intensity distribution in the beam. In addition, it will generally comprise various other components, such as an integrator iN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device (and interferometric measuring device IF), the substrate table WT can be moved accurately, e.g., so as to position different target portions C in the path of the beam PB. Similarly, the first positioning device can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash." Instead, the mask table MT is movable in a given direction (the so-called "scan direction," e.g., the y direction) with a speed v, so that the beam PB is caused to scan over a mask image; concurrently, the substrate table WT is simultaneously moved in the same or opposite direction at a speed V Mv, in which M is the magnification of the lens PL (typically, M=¼ or ⅕). In this manner, a relatively large target portion C can be exposed, without having to compromise on resolution.

Figure 2:
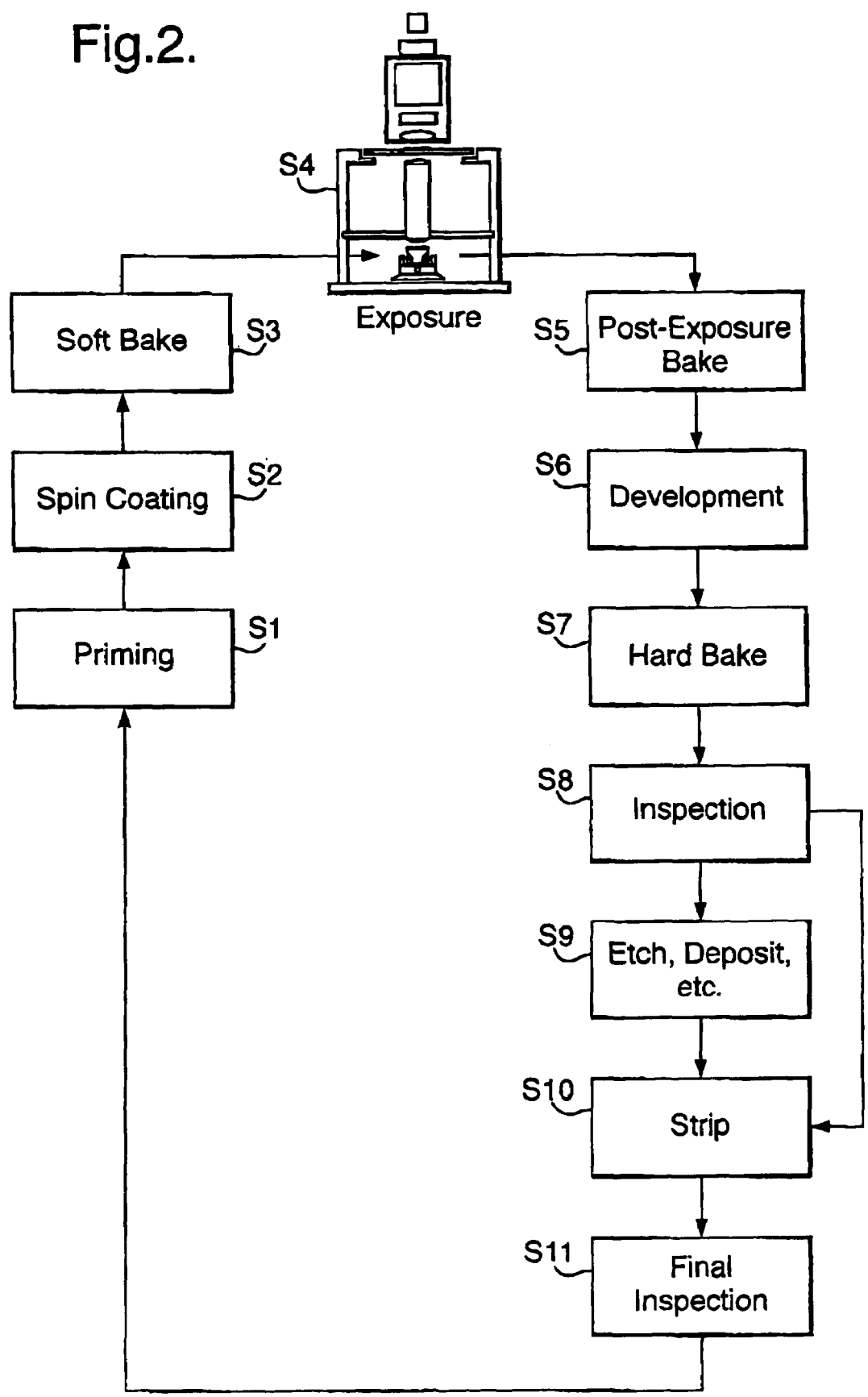
FIG. 2 is a flow diagram of a lithographic process which may be used in the manufacture of devices that may be inspected using the invention.

FIG. 2 is a flow diagram of a lithographic process of which the present invention may form part. Prior to the exposure S4, which may be carried out using a lithographic apparatus such as described above with relation to FIG. 1, a substrate, e.g., a silicon wafer, undergoes a priming S1, spin coating S2 to coat it with a layer of resist and a soft bake S3 to remove solvents from the resist. After exposure, the wafer undergoes a post-exposure bake S5, a development S6 during which the exposed or unexposed resist (depending on whether the resist is positive or negative) is removed and a hard bake S7, prior to an inspection S8. The inspection S8 includes various different measurements and inspections and according to the invention includes a metrology step described further below. If the wafer passes inspection, a process S9 is carried out. This may involve etching the areas of the substrate not covered by resist, deposition of a product layer, metallisation, ion implantation, etc. After the process S9 the remaining resist is stripped S10 and a final inspection S11 carried out before the process resumes for another layer. In case a substrate fails an inspection at S8, it may be directed directly to a stripping S10 and another attempt to print the same process layer made. Although it is preferred that the inspection step be performed after the hard bake S7, in some instances it may be performed after the post-exposure bake S5 or even directly after exposure S4. The manner in which this may be done is described further below.

Figure 3:
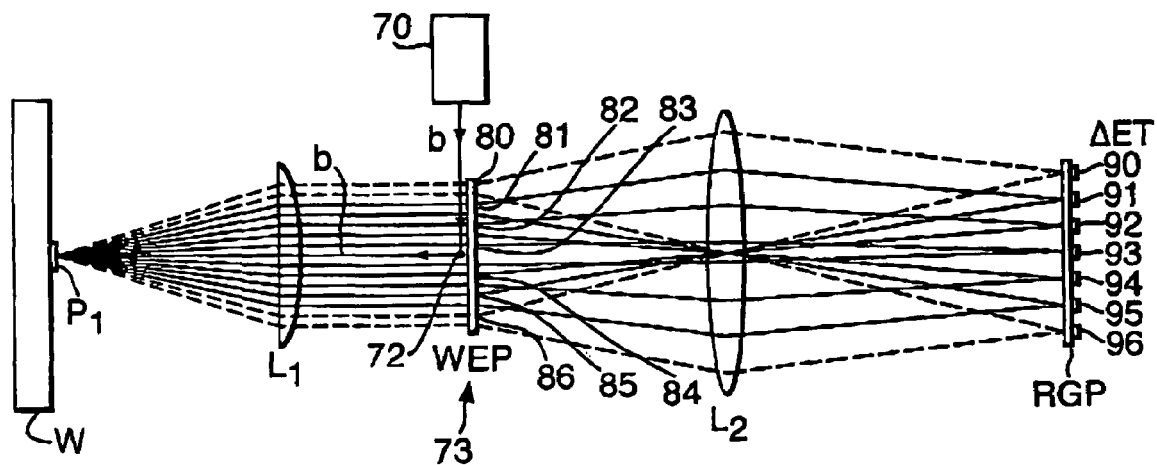
FIGS. 3 and 4 depict schematically metrology units which may be used according to the present invention.

In the inspection a metrology unit of the type shown in FIG. 3 is used. The metrology unit corresponds with a prior art alignment unit, for example as described in U.S. Pat. No. 6,297,876, which is incorporated herein by reference. Referring to FIG. 3, a substrate mark is provided in the form of a diffraction grating, $P_1$. An illumination beam b having a wavelength λ incident on the diffraction grating is split up into a number of sub-beams extending at different angles $α_n$ (not labeled) to the normal on the diffraction grating, which angles are defined by the known diffraction grating formula:

$$\sin α_n = nλ/P$$

where n is the diffraction order number and P the diffraction grating period. For the further use in this document a diffraction grating is defined as a series of lines and spaces. In an intensity diffraction grating the lines and spaces have a different reflectivity, all lines having substantially equal reflectivity and all spaces having substantially equal reflectivity. When a radiation beam with flat wavefronts impinges on an intensity diffraction grating the intensity at the lines and spaces is different in the plane where the radiation leaves the diffraction grating. In a phase diffraction grating the lines and spaces have substantially the same reflectivity, but they have different refractive indices and/or different heights. When a radiation beam with flat wavefronts impinges on a phase diffraction grating the phase at the lines and spaces is different in the plane where the radiation leaves the diffraction grating.

The path of the sub-beams reflected by the diffraction grating incorporates a lens system $L_1$ which converts the different directions of the sub-beams into different positions $u_n$ of these sub-beams in a plane 73:

$$u_n = f_1 \alpha_n$$

In this plane the different sub-beams are further separated. To this end, a plate may be arranged in this plane, which is provided with deflection elements in the form of, for example, wedges. In FIG. 3 the wedge plate is denoted by WEP. The wedges are provided on, for example the rear side of the plate. A prism 72 can then be provided on the front side of the plate, with which an incident beam coming from the radiation source 70, for example a He-Ne laser, can be coupled into the metrology sensor. This prism can also prevent the 0-order sub-beam from reaching the detectors (the 0-order sub-beam is not desired at the detectors). The number of wedges corresponds to the number of sub-beams which is to be used. In the embodiment shown, there are six wedges per dimension plus orders so that the sub-beams can be used up to and including the 7th-order. All wedges have a different wedge angle so that an optimal separation of the different sub-beams is obtained.

A second lens system $L_2$ is arranged behind the wedge plate. This lens system images the mark $P_1$ in the plane reference plate RGP. In the absence of the wedge plate, all sub-beams would be superimposed in the reference plane. Since the different sub-beams through the wedge plate are deflected at different angles, the images formed by the sub-beams reach different positions in the reference plane. These positions $X_n$ are given by:

$$X_n = f_2 \gamma_n$$

in which $\gamma$ is the angle at which a sub-beam is deflected by the wedge plate.

At these positions, reference diffraction gratings are provided. A separate detector 90–96 is arranged behind each of the reference diffraction gratings. The output signal of each detector is dependent upon the extent to which the image of the substrate diffraction grating P.sub. 1 coincides with the relevant reference diffraction grating. The period of each diffraction grating is adapted to the order number of the associated sub-beam incident on that diffraction grating. As the order number increases, the period decreases.

Figure 4:
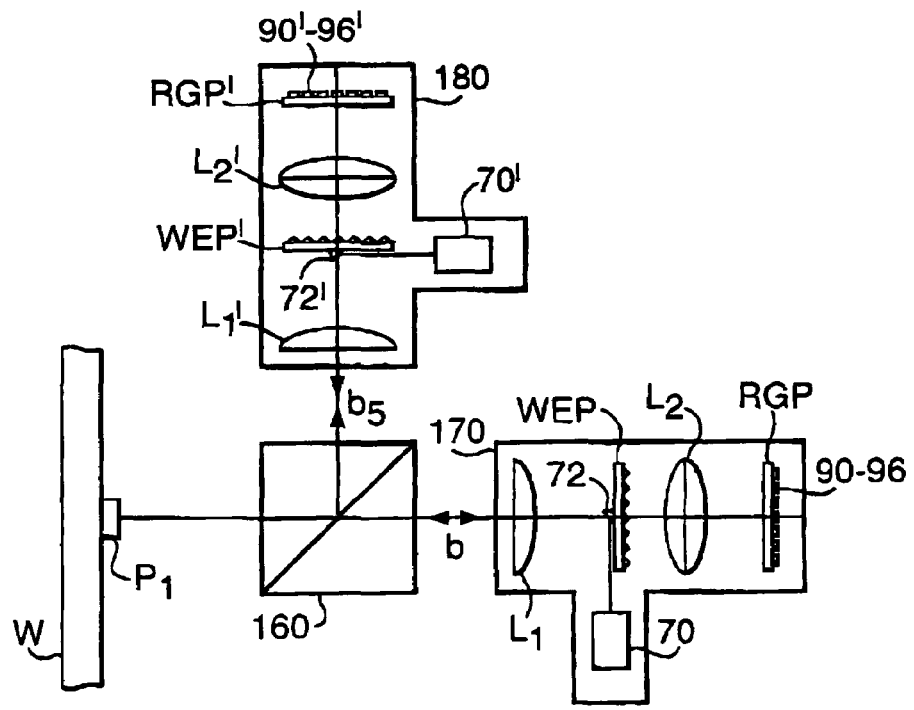

FIG. 4 shows a metrology unit, of the type shown in FIG. 3, arranged to use two wavelengths. In FIG. 4 the reference numeral 160 denotes a polarisation sensitive beam splitter. This beam splitter receives a first beam b having a first wavelength $\lambda_1$, for example 633 nm, from a He—Ne laser, and having a first direction of polarisation and passes this beam to the substrate alignment mark $P_1$. Incident on this beam splitter is also a second alignment beam $b_5$, which has a second wavelength $\lambda_2$, for example 532 nm and comes from a YAG laser preceding a frequency doubler. The beam $b_5$ has a direction of polarisation which is perpendicular to that of the beam b so that the beam $b_5$ is reflected to the substrate mark $P_1$. It has been ensured that the chief rays of the beams b and $b_5$ are made to coincide by the beam splitter so that these beams will be passed as one beam to the mark $P_1$. After reflection by the mark, the beams b and $b_5$ are split again by the beam splitter. A separate unit 170, 180 is present for each of these beams. Each of these units emits an incident beam and receives, via the beam splitter, the sub-beams of the different diffraction orders coming from the substrate mark. In each of these units, images of the substrate mark are formed on different reference diffraction gratings and with different sub-beams, as has been described with reference to FIG. 3. To this end, each unit is provided with a lens system $L_1$, $L_2$ ($L_1'$, $L_2'$), a wedge plate WEP (WEP'), a plate with reference diffraction gratings RGP (RGP'), a number of detectors 90–96 (90'–96') and a radiation source 70 (70') whose beam is coupled into the system via a coupling prism 72 (72').

A metrology unit of the type shown in FIG. 3 or in FIG. 4 is conveniently located to allow in-line metrology to be performed. In one implementation of the invention the metrology unit is located in a track (a track carries wafers to and from storage, and in addition bakes and develops wafers). The metrology unit is located downstream of postexposure baking and developing, such that patterns exposed in the resist layer are clearly visible to the unit. In an alternative implementation the metrology unit is located adjacent to, and is connected to, the track. Wafers pass from the track to the metrology unit and are returned to the track following measurement. The connection to the track is via a conventional output port, and is located downstream of post-exposure baking and developing. In a further alternative implementation the metrology unit is provided in a separate apparatus that is not connected to the track, i.e. off-line. The metrology unit may alternatively be provided within the lithographic projection apparatus (this implementation is described further below).

During production (i.e. in-line) a marker comprising a diffraction grating is exposed onto a wafer during projection of device features onto the wafer. The diffraction grating may be located in a specific designated non-product area, or may be located in scribe lines which separate product structures. The wafer is developed, baked and processed. The diffraction grating may be used during inspection for focus metrology, as described further below, or for critical dimension metrology. Inspection may occur at any convenient time as indicated above in relation to FIG. 2.

Where overlay metrology is required, processing of the diffraction grating and product features is completed so that they are permanently held on the wafer. A layer of resist is spun onto the wafer, and a subsequent layer of product features is exposed onto the wafer, together with a second diffraction grating. The second diffraction grating is located above the first diffraction grating, thereby forming an asymmetric marker. Measurements of the positions of the first and second diffraction gratings comprising the marker (for example detected individually or as a composite diffraction grating) are made using different diffraction orders or wavelengths of the metrology unit. These measurements are used to determine the overlay.

Figure 5:
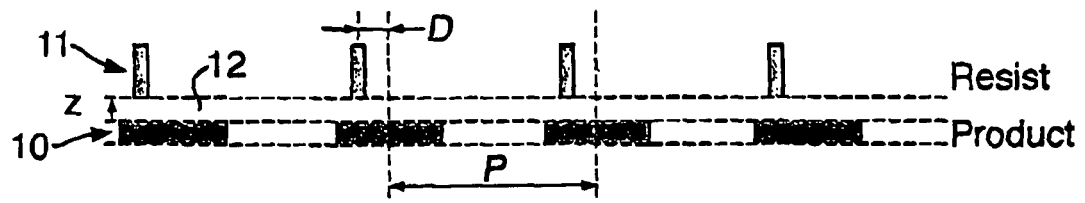
FIG. 5 depicts schematically a metrology diffraction grating used in a method according to the present invention.

In one embodiment of the invention the marker comprises a first diffraction grating 10 provided in a product layer of a wafer, and a second diffraction grating 11 provided in a resist layer of the wafer, as shown in FIG. 5. There is some vertical separation between the diffraction gratings 10, 11, for example due to an oxide layer 12 located over the product layer. The second diffraction 11 grating has the same period P as the first diffraction grating 10, although each line of the second diffraction grating is narrower. The second diffraction grating is deliberately displaced relative to the first diffraction grating, by a shift D. The two diffraction gratings can be considered as one marker comprising a composite diffraction grating with a certain overall shape. The composite diffraction grating includes an asymmetry caused by the deliberate shift D between the first and second diffraction gratings. Although each line of the second diffraction grating shown in FIG. 5 is narrower than the first diffraction grating, it is not essential that this is the case. All that is required is that the second diffraction grating together with some portion of the first diffraction grating is visible to the metrology unit (for example, each line of the first diffraction grating may be wider than those of the second diffraction grating, the second diffraction grating being visible due to the deliberate shift D).

As a result of the asymmetry the apparent position, as measured by the metrology unit of FIGS. 3 and 4, of the composite diffraction grating is shifted. This shift $x_{shift}$ is dependent upon the detected wavelength ($\lambda$) and diffraction order n. Since the shift is wavelength and diffraction order dependent, this allows information regarding the shift to be obtained by comparing positions measured for different wavelengths and diffraction orders. Where the shift includes the deliberate shift D and a shift caused by inaccuracies of the lithographic projection apparatus (e.g. overlay errors), the size and sign of the shift caused by the inaccuracies can be measured by comparing that shift with the deliberate shift. This provides in-line metrology measurements of the wafer. It will be appreciated that the deliberate shift D is one of many ways in which an asymmetry may be introduced between the first and second diffraction gratings in order to facilitate in-line metrology measurements. Alternative ways of introducing the asymmetry are described further below.

During the metrology measurement the substrate is scanned relative to the metrology unit. It will be appreciated that the substrate may be fixed, with for example reference diffraction gratings (RGP in FIG. 3) of the metrology unit being scanned; all that is required is that there is relative movement between the substrate and the reference diffraction gratings. The scan is transverse to the direction of the lines of the diffraction grating, and has the effect that an image of the diffraction grating $P_1$ passes over each reference diffraction grating RGP (RGP') thereby generating a sinusoidal signal at the detectors 90–96 (90'–96'). The sinusoidal signal is recorded as a function of the position of the substrate, the centre of the diffraction grating $P_1$ being determined as the position at which the sinusoidal signals from each of the detectors pass through peaks.

Scanning of the substrate is achieved by scanning the substrate table (WT in FIG. 1). Movement of the substrate table will introduce a small unknown position error $\Delta x_{stage}(t)$ of the substrate table. Taking account of this error, during scanning the detected metrology signal as a function of time t can be written as:

$$I(n, \lambda, t) = a + b\cos\left[4\pi n \frac{vt + \Delta x_{stage}(t) + x_{shift}(n, \lambda, D)}{P}\right]$$

where n is the diffraction order, $\lambda$ is the wavelength, a and b are constants, and $\Delta x_{stage}(t)$ is the difference between the intended location vt of the substrate table and the actual location of the substrate table. For low-frequency errors the substrate table position error shows up as a position error in the measured position. Curve fitting, for example using a least squares fit, yields the following measured positions:

$$x_{measured}(n,\lambda,t,D) = \Delta x_{stage}(t) + x_{shift}(n,\lambda,D)$$

Measuring the difference in measured position between any order/color yields a Shift-between-Orders SbO:

$$SbO(m,n,\lambda_1,\lambda_2,t_1,t_2,D) = x_{measured}(m,\lambda_1,t_1,D) - x_{measured}(n,\lambda_2,t_2,D) = x_{shift}(m,\lambda_1,D) - x_{shift}(n,\lambda_2,D) + \Delta x_{stage}(t_1) - \Delta x_{stage}(t_2)$$

where m and n indicate diffraction orders, and $\lambda_1$ and $\lambda_2$ indicate wavelengths.

As indicated in the above equation, the term 'shift-between-orders' (SbO) refers to a difference in measured position which arises when different diffraction orders are measured or when different wavelengths are measured for the same diffraction order or different wavelengths are measured for different diffraction orders. For ease of terminology the term does not specifically refer to different wavelengths. This is not intended to imply at any point in this document that differences in measured positions arising from different wavelength measurements are excluded.

Both position measurements may be done at the same time t. The stage errors now cancel out in SbO which reduces to $$SbO(m,n,\lambda_1,\lambda_2,D) = x_{shift}(m,\lambda_1,D) - x_{shift}(n,\lambda_2,D)$$

so that SbO is independent of time and stage errors.

In another embodiment the selected orders and wavelengths and measurement times t are kept fixed so that the SbO is a function only of the offset D.

Due to the symmetry of the setup:

$$SbO(D) = -SbO(-D)$$

In order to measure overlay two composite diffraction gratings are printed with opposite offsets D+$\delta$ and $-$D+$\delta$, where D indicates a deliberate shift and $\delta$ indicates shifts caused by inaccuracies of the lithographic projection apparatus. In case of perfect overlay $\delta$=0 and the sum of the SbO's would be zero. This yields a simple overlay metrology measurement, which indicates when, to the resolution of the metrology unit (for example less than 1 nm), the overlay is perfect. However, it will almost certainly be the case that the overlay is not perfect, whereupon the overlay error is quantified to provide a useful metrology measurement.

The overlay error is quantified by comparing the error with a known small offset. Taking the overlay error OV as 2OV=2$\delta$, OV can be expressed as follows:

$$SbO(t_1, t_2, D+\delta) + SbO(t_3, t_4, -(D+\delta)) = 2OV \frac{dSbO(0)}{dx} + \Delta x_{stage}(t_1) - \Delta x_{stage}(t_2) + \Delta x_{stage}(t_3) - \Delta x_{stage}(t_4)$$

If pairs of position measurements are performed at the same time, as described above, then $t_1$=$t_2$ and $t_3$=$t_4$ so that the stage errors $\Delta x_{stage}(t)$ errors cancel out. In order to quantify the overlay error it is necessary to determine how rapidly the SbO varies for small changes in $\delta_1$ and $\delta_2$, i.e. as a function of the overlay error. This sensitivity is measured with a third diffraction grating that is printed with a shift D+d+$\delta$ where d is a small known offset. Assuming linearity, which is the case for overlay errors observed in practice, the sensitivity of the SbO for small displacements is given by:

$$\frac{dSbO}{dx} = \frac{SbO(D+d+\delta) - SbO(D+\delta)}{d+\delta_3-\delta_1} +$$

-continued $$\frac{\Delta x_{stage}(t_5) - \Delta x_{stage}(t_6) + \Delta x_{stage}(t_1) - \Delta x_{stage}(t_2)}{d + \delta_3 - \delta_1}$$

The stage errors may again be cancelled out as indicated above. The value of d is determined by conflicting requirements: on one hand it must be large to justify approximating d+δ=d and to minimize noise but on the other hand it must be sufficiently small to guarantee linearity. Typically, d should be the same size, or slightly larger, than the largest overlay error that it is desired to be able to measure, for example d could be of the order of hundreds of nanometers. Other suitable values may be used. The overlay follows from the following measurement on the three diffraction gratings:

$$OV = -\frac{d}{2} \frac{SbO(D) + SbO(-D)}{SbO(D) - SbO(D+d)}$$

This measurement can be done for many order/wavelength pairs, although in practice only the order/wavelength pair with the highest sensitivity need be used.

Each diffraction grating may have a size of a few tens of square microns. There may be an exclusion zone of a few microns around each diffraction grating. The diffraction gratings may be provided in a scribe lane adjacent to a corner of a die. It may be desired to perform metrology measurements in more than one corner of the die. One manner in which this may be done is by providing the three diffraction gratings in each corner in which measurement is required. Alternatively, to reduce the number of diffraction gratings, thereby freeing space for other elements, three diffraction gratings may be provided for one corner of the die and only single diffraction gratings provided in other corners for which measurements are required (i.e. one diffraction grating per corner). Overlay measured using the single diffraction grating is quantified using the sensitivity measurement obtained using the three diffraction gratings. This takes advantage of the fact that the sensitivity of the measurement does not vary significantly between corners of the die.

In a situation where all detectors form a detector plane (e.g. as shown in FIG. 3), the signal intensity signal in that detector plane is the convolution $C_{(i,x,y)}$ between the Fourier transformation $\Sigma F_{(i,x,y)}$ of the periodic signal of the diffraction grating with the Fourier transformation of an intensity function $I_{(x,y)}$ (the indices i represent the different orders). The intensity function $I_{(x,y)}$ is the product of an intensity profile $Ip_{(x,y)}$ of the beam incident on the diffraction grating with the existence $E_{(x,y)}$ of the diffraction grating at that position (where $E_{(x,y)}$ indicates the spatial extent of the diffraction grating, i.e. $E_{(x,y)}$=1 on the diffraction grating and $E_{(x,y)}$=0 at other places):

$$I_{(x,y)} = Ip_{(x,y)} \cdot E_{(x,y)}$$

A given detector is intended to detect a only one particular order j at $(x_j, y_j)$. However, the convolution $C_{(i,x,y)}$ may lead to a proportion of a different order i being detected by that detector, thereby introducing an error into the signal detected for the order j. This is expressed mathematically as $C_{(i,x_j,y_j)} \neq 0$. This can be understood intuitively by considering that due to the finite length of the diffraction grating, the image of the order i at the detector plane may be spatially broad enough that its edges are incident upon the detector intended for order j.

As will be apparent to a person skilled in the art, there are several known solutions to this problem. An example is that the intensity profile $Ip_{(x,y)}$ can be chosen so that $C_{(i,x,y)}$ is not significant compared to $C_{(j,x_j,y_j)}$. Another example is that the period of the diffraction grating may be chosen so that $F_{(i,x_j,y_j)}$ is so small that $C_{(i,x_j,y_j)}$ is not significant compared to $C_{(j,x_j,y_j)}$. $F_{(i,x_j,y_j)}$ can be kept small either because the separation between the positions of maximum signal from order i and j is far apart or because $F_{(i,x_j,y_j)}$ has a local minimum at $(x_j, y_j)$.

In addition to occurring for the above described embodiment of the invention, the problem of overlapping signals may also occur for embodiments of the invention that are described below. The above solutions may be applied for these embodiments.

In a variation of the embodiment of the invention, a pair of diffraction gratings may be used to obtain the overlay metrology measurement, instead of three diffraction gratings. This is advantageous because it occupies a lesser amount of scribe lane area. The reduction to two diffraction gratings is possible due to the realisation that the sensitivity quantification offset d may be incorporated into one of the deliberate offsets D, –D.

In general terms the detected shift between orders may be considered to be caused by an offset Δx between the diffraction gratings and a scaling factor k which depends upon the 'depth' of the diffraction gratings and their separation ('z' in FIG. 5). This can be expressed as:

$$SbO = k\Delta x$$

where the offset is a combination of a deliberate offset D and an overlay error OV:

$$\Delta x = D + OV$$

If two diffraction gratings are used then this provides two shift between order measurements, which provides sufficient information to allow the two unknown values k, OV to be determined (the deliberate offset D is known from the design of the mask from which the diffraction gratings are projected):

$$SbO_1 = k(D + OV)$$

$$SbO_2 = k(D - OV)$$

This is equivalent to making the sensitivity quantification offset d equal to (+D–2D). The overlay follows from the measurement on the two diffraction gratings:

$$OV = \frac{D}{2} \frac{SbO_2 + SbO_1}{SbO_1 - SbO_2}$$

The above description relates to an embodiment of the invention in which a composite diffraction grating is formed using two overlapping diffraction gratings having the same periods. Resist and product diffraction gratings of equal periods, however, yield a strong coupling between the diffraction gratings. Due to this coupling, the shift between orders is not only a function of overlay it is also affected by vertical diffraction grating separation (z in FIG. 5), wavelength, and diffraction grating shape. For this reason calibration based upon two or more composite diffraction gratings is required.

In an alternative embodiment of the invention the shift between orders is measured for a marker comprising diffraction gratings which are not coupled (strictly speaking all diffraction gratings are coupled to a greater or lesser extent; the term 'not coupled' is intended to mean that the size of the signal arising from the coupling is much smaller than that arising individually from each diffraction grating). This alternative embodiment is based on spatial frequency multiplexing, and uses diffraction gratings with different periods of (P/N) and (P/M). P may be of the order of tens of microns. These periods are selected to be compatible with metrology unit reference diffraction gratings which have periods of P/(1,2 . . . 7). It will be appreciated that any other suitable periods may be used. The measured shift between orders is directly proportional to overlay, and hence a calibration with multiple markers is no longer necessary. Overlay errors make the marker comprising the diffraction gratings asymmetric, and it is this asymmetry that is measured using the shift between orders (i.e. the difference in the positions of the diffraction gratings).

The alternative embodiment of the invention is based upon the fact that diffraction from a diffraction grating of a given period, e.g. P/6 will be detected strongly at the metrology unit reference diffraction grating which has the same period. Diffraction from a diffraction grating of a different period, e.g. P/7 will be detected strongly at the metrology unit reference diffraction grating which has that period. This means that it is possible to detect separately diffraction gratings in the product layer and the resist layer even if they lie over one another, by looking at different diffraction orders. The difference between the measured positions, the SbO, indicates directly the overlay of the diffraction gratings. It will be appreciated that this embodiment of the invention may use different wavelengths of illumination instead of different diffraction orders (all that is required is that the diffracted light from different diffraction gratings is strongly detected by different metrology unit reference diffraction gratings).

A diffraction grating running in the x-direction is exposed and processed on the wafer. The resulting, fixed diffraction grating, is referred to herein as being in the product layer. The diffraction grating has a period P/N where N is one of the following: 1, 2 . . . 7. Before the wafer is exposed, this diffraction grating is covered with a resist film. The reflected field prior to exposure can be expressed as:

$$E(x,y) = [\overline{F} + F_N(x,y)]$$

Figure 6:
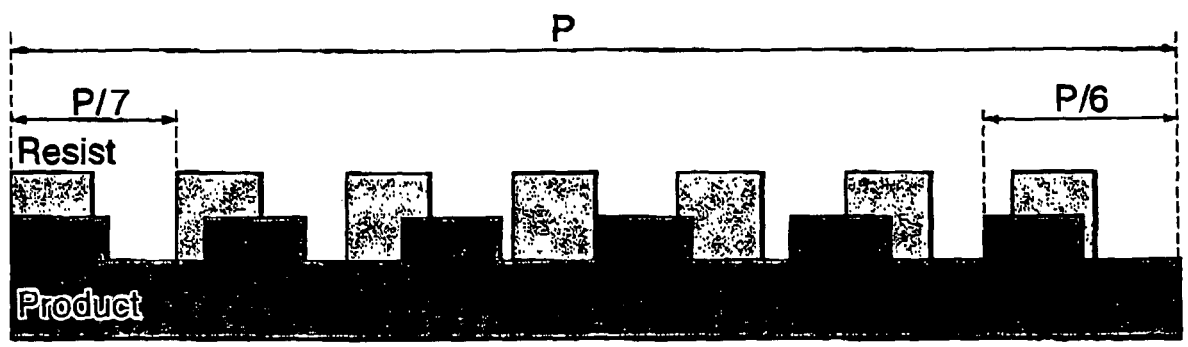
FIG. 6 depicts schematically a metrology diffraction grating used in an alternative method according to the present invention.

The subscript N indicates the periodicity of P/N and $\overline{F}$ is the average complex value of the reflected field (the so called 0-order). The complex amplitudes of the other orders follow from a Fourier decomposition of $F_N$. The resist is then exposed with a higher-order diffraction grating with period P/M, where M is one of the following: 1,2, . . . 7 (M≠N). This produces, after development, a resist diffraction grating on top of the product diffraction grating as shown in FIG. 6. In FIG. 6 the product diffraction grating has a period of P/6 (i.e. N=6), and the resist diffraction grating has a period of P/7 (i.e. M=7).

The resist diffraction grating perturbs the field reflected by the product diffraction grating, so that it is no longer in the simple form indicated above. Assuming an overlay error of $x_0$ between the product diffraction grating and the resist diffraction grating, the reflected field may be expressed in the following form:

$$E(x,y) = [\overline{F} + F_N(x,y)] \cdot [\overline{G} + G_M(x-x_0, y)]$$
$$= \overline{FG} + \overline{G}F_N(x,y) + \overline{F}G_M(x-x_0, y) + F_N(x,y)G_M(x-x_0, y)$$

Figure 7:
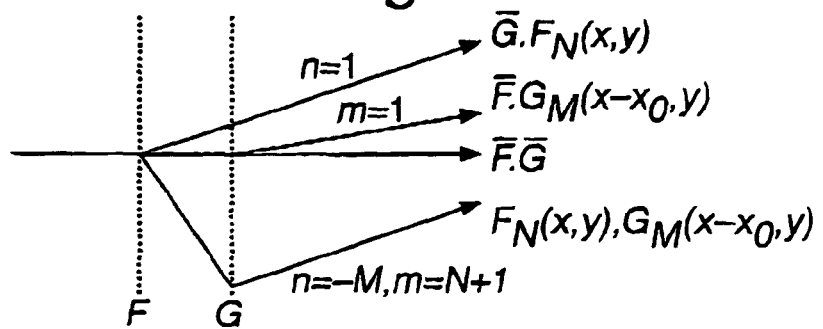
FIG. 7 schematically illustrates coupling between diffraction gratings.

In order to provide a graphical explanation of these terms, they are shown in FIG. 7 for two transmission diffraction gratings F and G with different periods of N and M respectively (transmission diffraction gratings are used in place of reflection diffraction gratings for ease of illustration).

The term $\overline{F}.\overline{G}$ is a zero order transmitted by F and G.

The terms used for overlay metrology are $\overline{G}F_N(x,y)$ and $\overline{F}G_M(x-x_0, y)$. The term $F_N(x,y)G_M(x-x_0, y)$, which comprises orders that have been diffracted by both diffraction gratings, is not used for metrology in this embodiment. These terms have each been diffracted by only one diffraction grating, the diffraction grating F and the diffraction grating G respectively. The position of the product diffraction grating is measured by the term $\overline{G}F_N(x,y)$ and the position of the resist diffraction grating is measured by the term $\overline{F}G_M(x-x_0, y)$, the difference between the two measured positions indicating the overlay error. In other words, the SbO of $\overline{G}F_N(x,y)$ and $\overline{F}G_M(x-x_0, y)$ is directly equal to the overlay. The metrology unit measures the position of the product diffraction grating by monitoring only diffraction gratings having a period of P/6, and then subsequently measures the position of the resist diffraction grating by monitoring only diffraction gratings having a period of P/7. The difference between the positions of the diffraction gratings indicates the overlay error between the resist layer and the product layer.

The alternative embodiment of the invention may be considered as a form of spatial frequency multiplexing: the resist and product diffraction gratings can be measured separately by the metrology unit since they have different spatial frequencies. The metrology unit is able to measure these separately since it is arranged to direct different diffraction orders to different detectors, as described above in relation to FIG. 3.

It will be appreciated that diffraction gratings having periods other than P/(N or M) may be used. Any suitable period may be used, with the proviso that N and M are not equal, and that they are selected such that mixing between diffraction orders will not lead to a combined signal (Moiré signal) with the same frequency as a signal which is detected by the metrology unit. For example, N=2 and M=4 is not recommended since the mixed signal will interfere with the signal from the product diffraction grating (this would work, but would provide lesser accuracy).

Periods may be chosen which will not lead to a problematic combined signal: the coupled term $F_N(x,y)G_M(x-x_0, y)$ comprises orders that have been diffracted by both diffraction gratings (this is shown as the lowermost beam in FIG. 7). It is desired to minimise the coupling term, since it may generate spatial frequency components at the measurement frequencies M and N. For example, in FIG. 7 the lowermost beam will introduce an error into measurement of the uppermost beam, since both beams have the same spatial frequency.

The periods are chosen such that N and M have no common divisor (for example N=6 and M=7). When this is done a first combined signal folds back to the detected order M and the a second combined signal solutions folds back to the detected order N. So again assuming N=6 and M=7, n=7 and m∈[−5,−7] fold back to detected order M, and m=6 and n∈[−6,−8] fold back to detected order N. The folded back signal will be very weak due to the high values of m and n.

The folded back signal caused by the coupled term will, if the above rule is followed, in most instances be of sufficiently low amplitude that it will not introduce any significant error into the overlay metrology measurement. One reason why the high frequency term is small in amplitude is that, due to processing of the wafer, the form of the diffraction gratings is closer to a sine wave than a square wave thereby suppressing higher harmonics.

Figure 8:
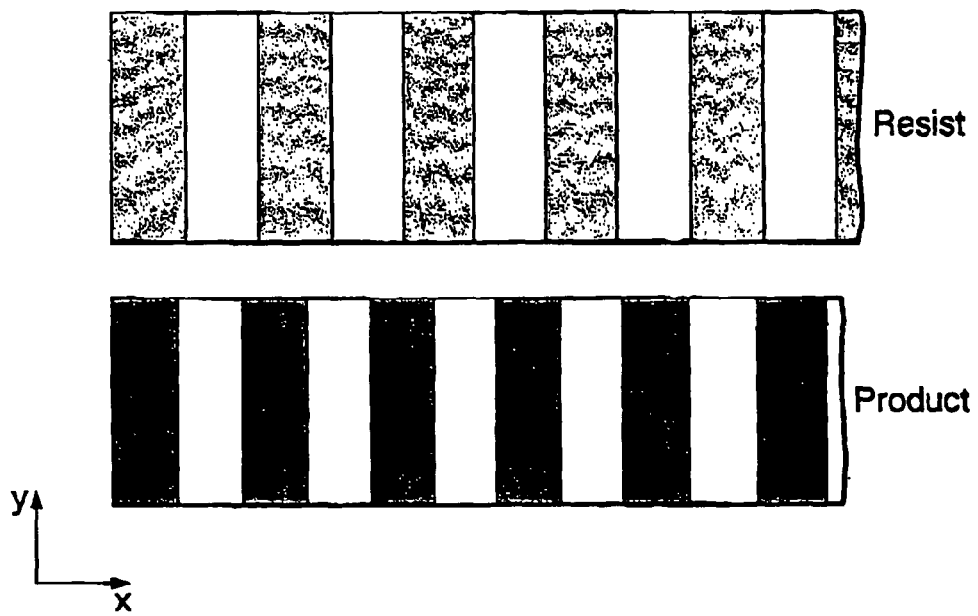
FIG. 8 depicts schematically a metrology diffraction grating used in an alternative method according to the present invention.

If desired, coupling between the diffraction gratings can be minimised in a further alternative embodiment of the invention by ensuring that there is no spatial overlap between the product diffraction grating and the resist diffraction gratings. This may be achieved by displacing the resist diffraction grating so that it lies adjacent the product diffraction grating, as shown in FIG. 8. The resist diffraction grating and the product diffraction grating have different periods as shown. Since the diffraction gratings do not overlap, to a first approximation there is no coupling between the diffraction gratings. The position of each diffraction grating in the x-direction is determined using the metrology unit, the difference between the positions indicating the overlay error.

A disadvantage associated with the diffraction grating arrangement shown in FIG. 8 is that if the x-axis of the wafer is not exactly parallel with the x-axis of the metrology unit, then scanning of the diffraction gratings during metrology measurement will lead to an error. This is because the metrology unit will, due to the rotation measure one of the diffraction gratings as being shifted in the x direction and the other diffraction grating as being shifted in the −x direction. This error can be cancelled out by providing a second pair of diffraction gratings in which the positions of the diffraction gratings have been swapped over. The swapping means that the sign of the error measured by the metrology unit is opposite and can be cancelled out from the measurement.

Figure 9:
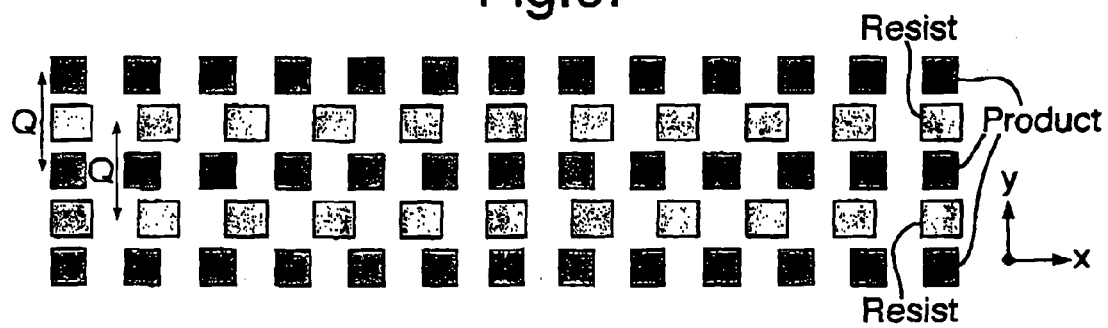
FIGS. 9 and 10 depict schematically a metrology diffraction grating used in an alternative method according to the present invention.

An alternative way of solving the problem of rotation induced error is to split the resist diffraction grating and the product diffraction grating into non-overlapping parts as shown in FIG. 9. Advantageously this embodiment of the invention in addition allows detection of large overlay errors in a perpendicular direction, as described below in relation to FIGS. 9 and 10.

Referring to FIG. 9, a product diffraction grating is separated into three parts, and a resist diffraction grating is separated into two parts. The parts are arranged so that they do not overlap with each other. The product diffraction grating and the resist diffraction grating are both symmetric about an axis in the x-direction which bisects both diffraction gratings. This configuration eliminates rotation induced errors.

The direction of measurement of the metrology unit, i.e. the direction in which the wafer is scanned during measurement, is indicated as x in FIG. 9 (this is conventional notation). The product diffraction grating has a period of P/7, whereas the resist diffraction grating has a period of P/6 (P is of the order of 10 microns). The direction in the plane of the wafer which is perpendicular to the direction of measurement is indicated as y in FIG. 9. The separation of each diffraction grating into three separate parts is such that the product diffraction grating and the resist diffraction grating are periodic in the y direction. They have the same period Q but they are mutually 180° degrees phase-shifted as shown in FIG. 9. Since the product diffraction grating and the resist diffraction grating are spatially separated, there is virtually no coupling between them (a small degree of residual coupling may remain). The position of the resist diffraction grating is measured using the metrology unit, and the position of the product diffraction grating is separately measured using the metrology unit, the difference in positions indicating the overlay error (as previously stated the measurement is performed in the x-direction).

The use of two dimensional diffraction gratings as shown in FIG. 9 has the advantage that rotation induced errors are avoided. It has the further advantage that it allows detection of large overlay errors in the y-direction, which may arise due to an alignment error commonly referred to as a capture error. Where a phase diffraction grating alignment mark is used, the signal used to provide alignment is sinusoidal. Assuming that in a pre-alignment operation the alignment mark is positioned sufficiently close to its intended position, an alignment unit will see a portion of the sinusoidal signal which comprises the peak which allows correct alignment. However, if the pre-alignment operation is not performed correctly, the alignment unit may see a portion of the sinusoidal signal which comprises an adjacent peak. Alignment to this adjacent peak will then occur, causing an error. The size of the error is dependent upon the separation of adjacent peaks of the sinusoidal signal, and is typically around 10 microns. The two dimensional diffraction gratings provide a means for detecting an overlay error caused by the capture error (i.e. an overlay error of around 10 microns).

Figure 10A:
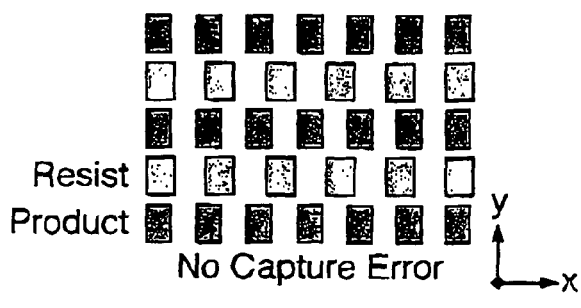
Figure 10B:
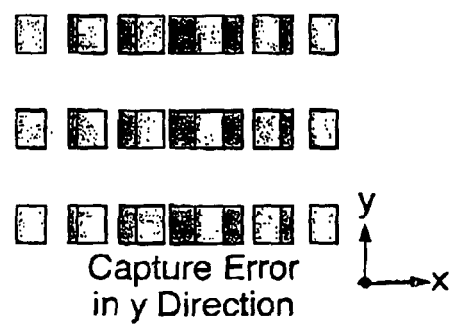

Referring to FIG. 10a, in the absence of a capture error the product diffraction grating and resist diffraction grating are well separated. If capture error in the y-direction occurs then the diffraction gratings overlap, as shown in FIG. 10b. The separation of the diffraction gratings is detected by monitoring coupling between the diffraction gratings, i.e. the coupled term of the diffraction signal (described previously in relation to FIG. 7). The coupling shows up as a spatial beat frequency that can be detected by detectors of the metrology unit (the frequency is |N−M|) A negligibly low level of coupling will be seen between the diffraction gratings shown in FIG. 10a, thereby indicating that a capture error has not occurred. A strongly coupled signal indicates that a capture error has occurred. In order for overlay of the diffraction grating to occur in the presence of a capture error the period Q must be properly chosen. For example a period Q which is equal to one third of the expected capture error will give a complete overlap of the two diffraction gratings if a capture error occurs.

The diffraction gratings shown in FIG. 9 comprise three product parts and two resist parts. It will be appreciated that different numbers of parts may be used, the only constraint being that both parts must have the same axis of symmetry in the x-direction if rotation induced errors are to be avoided. This means that the minimum number of parts is two product parts and one resist part or two resist parts and one product part.

The two dimensional diffraction gratings shown in FIG. 10 provide easy and robust detection of capture errors. It will be appreciated that the period in the y-direction may be selected to provide detection of other sized errors.

Figure 11:
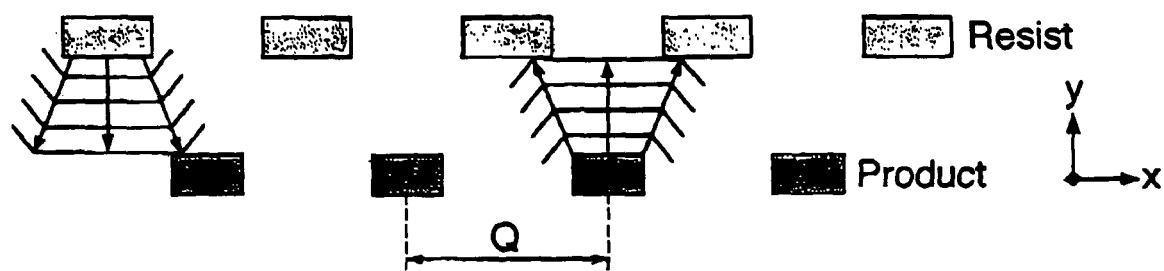
FIGS. 11 and 12 illustrate schematically a method which may be used in combination with the present invention to reduce measurement errors.
Figure 12:
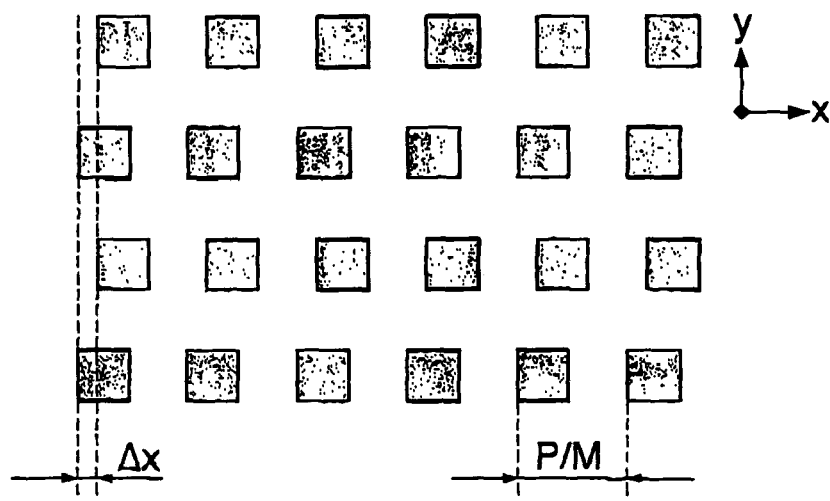

In the above description it is noted that a negligibly low level of coupling will be seen between the diffraction gratings shown in FIG. 10a. The reason why the coupling is not zero is explained in relation to FIG. 11, which is a cross-sectional side view of the diffraction gratings shown in FIG. 10a. From FIG. 11 it can be seen that there is a significant separation in the z-direction between the product diffraction grating and the resist diffraction grating. This is may be because there is a layer of oxide above the product diffraction grating, or may be due to several other product layers being located over the product diffraction grating. Light used to illuminate the diffraction gratings for metrology measurements will diverge a little between the resist and product layers as shown, thereby introducing some coupling between the diffraction gratings.

If it is desired to avoid the coupling shown in FIG. 10 a simple modification of the resist diffraction grating may be made. The modification, shown in FIG. 11, comprises introducing alternating shifts $\Delta x$ of the diffraction grating in the x-direction. When this diffraction grating configuration is used, the $N^{th}$ order of the shifted diffraction gratings experiences a phase shift of:

$$\Delta \varphi_N = 2\pi \frac{MN}{16} \Delta x$$

When $\Delta \phi_N = \pi$ the $N^{th}$ order of the shifted diffraction gratings is in anti-phase with the unshifted diffraction gratings so that the $N^{th}$ order will vanish, thereby eliminating the coupling. This allows high diffraction orders to be eliminated so that they do not introduce measurement errors at the detectors of the metrology unit. The method requires that illumination of the diffraction gratings is symmetric, something which is achievable in practice.

As described further above errors of the position of the wafer stage $\Delta_{stage}$ are cancelled out by the measurement performed using the metrology unit. There is however a second error which may reduce the accuracy of the metrology measurement. The second error is referred to as the sensor error $\in$ (sometimes this is referred to in the art as the tool induced shift). Whilst the wafer stage position error $\Delta_{stage}$ is caused by the wafer stage not being located at the precise location that it is believed to occupy, the sensor error $\in$ is caused by the fact that the optics of the metrology unit are not perfect. Imperfections of the optics of the metrology unit mean that the position of a diffraction grating as measured by a first detector of the metrology unit is not exactly the same as the position of the diffraction grating as measured by a second detector of the metrology unit, the optics having slightly displaced the diffraction patterns generated by the diffraction grating.

Where metrology is being performed based upon two diffraction gratings having different periods (described above), the sensor error $\in$ in the SbO calibration of the sensor can be eliminated by printing two pairs of diffraction gratings. The first pair has the $M^{th}$ order in the resist layer and the $N^{th}$ order in the product layer. The overlay measured with this pair is:

$$OV_1 = SbO_{n,m} + \in$$

In the second pair, the diffraction gratings are interchanged: the $N^{th}$ order is in the resist and the $M^{th}$ order diffraction grating is in the product layer. The overlay is:

$$OV_2 = -SbO_{n,m} + \in$$

The real SbO (i.e. overlay) is determined by:

$$SbO_{n,m} = \frac{OV_1 - OV_2}{2}$$

The method eliminates sensor errors $\in$ in the calibration of the metrology unit.

Where metrology is being performed based upon two diffraction gratings having the same period (described further above), the sensor error $\in$ in the SbO calibration of the sensor can be eliminated by printing two pairs of diffraction gratings together with a single diffraction grating. Each pair of diffraction gratings comprises a diffraction grating in the product layer and a diffraction grating in the resist layer. The single diffraction grating is provided in the resist layer (it will be appreciated that it could be provided in the product layer). The first pair of diffraction gratings includes a deliberate shift D in the x-direction between the diffraction gratings, and the second pair of diffraction gratings includes a deliberate shift −D in the x-direction. Three shift between order SbO measurements are made, yielding the following:

$$SbO_1 = k(OV+D) + \in$$

$$SbO_2 = k(OV-D) + \in$$

$$SbO_3 = \in$$

where OV is the overlay and k is a constant that relates the shift between orders to the overlay. The third measurement yields the sensor error $\in$ directly, since if there was no error the shift between order would be zero (only one position is being measured). The two remaining unknowns k and OV can be determined using the first and second measurements, on the assumption that there is a linear relationship between the shift between orders and the overlay over the range of measured values.

In a further alternative embodiment of the invention an asymmetric marker is provided comprising a diffraction grating in a product layer and a diffraction grating in a resist layer which is offset due to overlay, as described further above, with the further addition that the lines of the diffraction gratings are provided with a substructure. The substructure of one of the diffraction gratings includes a phase jump. The combination of the high spatial frequency and the phase jump has the effect of significantly increasing the sensitivity of the metrology measurement. An advantage of using substructure in this way is that the substructure may be arranged to have dimensions and densities more similar to device features than conventional diffraction gratings, such that the measured overlay more accurately reflects the overlay of device features.

Figure 13A:
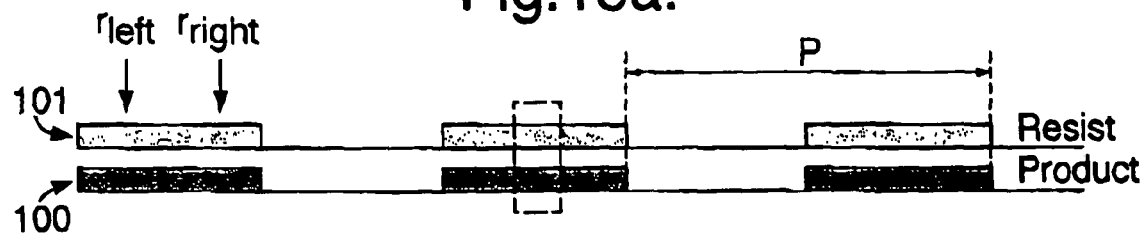
FIGS. 13 and 14 depict schematically a metrology diffraction grating used in an alternative method according to the present invention, together with a schematic illustration of the effect of the metrology diffraction grating.

Referring to FIG. 13a, which is cross-sectional, a first diffraction grating 100 is provided in a product layer of a wafer and a second diffraction grating 101 is provided in a resist layer of the wafer. Three periods of each diffraction grating are shown. The period P is the same for both diffraction gratings.

Figure 13B:
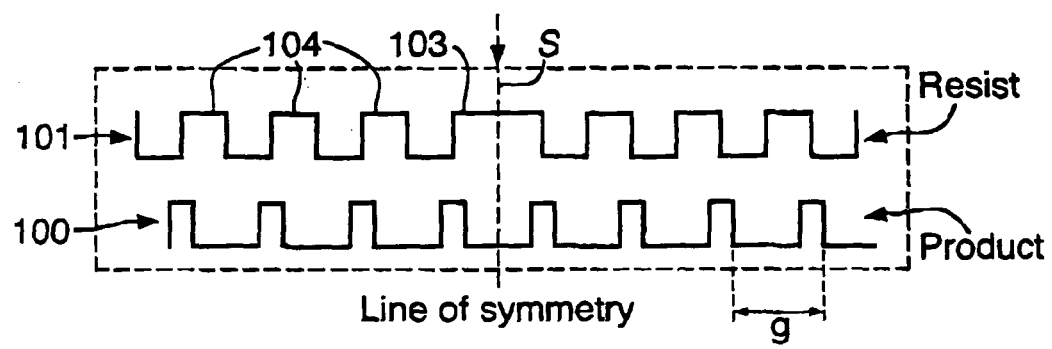

A central portion of one line of the diffraction grating, indicated by a box formed with a broken line, is shown in magnified detail in FIG. 13b. As can be seen in FIG. 13b each diffraction grating is provided with a diffraction grating substructure. The substructure of the product layer diffraction grating 100 is continuous, whereas the substructure of the resist layer diffraction grating 101 includes a 180 degree phase jump (it will be appreciated that the phase jump may be provided in the product diffraction grating instead of the resist diffraction grating). The 180 degree phase jump comprises a line 103 of the substructure which has double the length of other lines 104 of the substructure. The 180 degree phase jump has the effect that, relative to the product layer diffraction grating, a rising edge of the substructure of the resist layer diffraction grating will become a falling edge of the substructure of the resist layer diffraction grating. In the absence of an overlay error the product diffraction grating and the resist diffraction grating are symmetric about a line of symmetry s, as shown in FIG. 13b.

The period g of the substructure, shown in FIG. 13b, of the diffraction gratings is chosen to be near to the limit of resolution of the lithographic projection apparatus (typically of the order of hundreds of nanometers). It will be appreciated that this number may in the future be significantly smaller as the resolution of lithographic projection apparatus improves. The substructure is sufficiently large relative to the wavelength of the illumination that diffraction occurs and propagates between the product layer and the resist layer. However, the substructure is sufficiently small that the diffraction from the substructure is not seen by the detectors of the metrology unit (for example because the diffraction is at a very large angle to the normal and is not collected by the lens L1 (see FIGS. 3 and 4)). Since diffraction from the substructure either does not occur or is not seen, the metrology unit effectively sees the substructure as mirrors with a complex reflection coefficient r.

Figure 14:
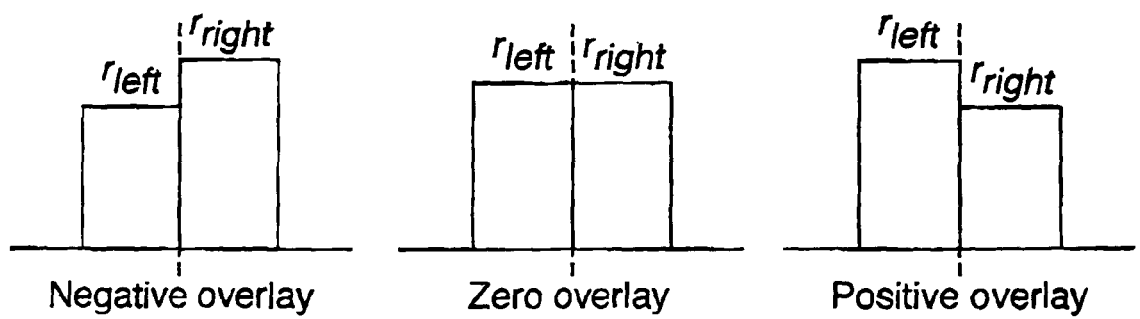

The complex reflection coefficient r depends upon the relative positions of the resist and product layer substructures. If overlay is perfect, then the complex reflection coefficient of the left side substructure of FIG. 13b will be the same as the complex reflection coefficient of the right side substructure of FIG. 13b. This is represented schematically in the centre of FIG. 14, which shows the amplitude immediately above the substructure of light reflected from each side of the substructure (the region immediately above the substructure is referred to here as the near field). If a negative overlay error occurs, i.e. the resist layer is shifted to the right, then the complex reflection coefficient of the left side substructure will be different than that of the right side substructure. This asymmetry will be manifested as an amplitude (and phase) difference in the near field, as shown in FIG. 14.

The detectors of the metrology unit, as shown in FIGS. 3 and 4, are located a distance away from the diffraction gratings. The location of the detectors, referred to here as the far field, is such that they detect the Fourier transform of the near field. If the amplitude (and phase) in the near field is symmetric then the Fourier transform is also symmetric, i.e. the detected signal does not include a shift. If on the other hand the amplitude (and phase) are not symmetric in the near field, then the Fourier transform is not symmetric, and has an asymmetry that depends upon the diffraction order (or wavelength). By determining the difference between positions measured for different diffraction orders (or wavelengths) at the detectors, the overlay of the resist layer and the product layer can be determined. The detected shift is much greater than the overlay error, and this means that very small overlay errors may be detected using the metrology unit.

Since the asymmetry seen in the far field (i.e. at the detectors) arises from the complex reflection coefficient, its sign will not always consistently agree with the sign of the overlay error.

Mathematically the effect of the substructure can be expressed as follows: In the case of a small overlay error the reflection coefficient of the left and right halves will vary differently according to:

$$r_{left} = r_0 + \Delta r_1(x)$$

$$r_{right} = r_0 - \Delta r_1(x)$$

The resulting left-right asymmetry will create a measurable shift between orders. The complex reflection change is periodic with the period of the substructure, which is a fraction of a micron. This means that an overlay error greater than the substructure will be incorrectly measured by the metrology unit.

The substructure is calibrated using two pairs of diffraction gratings and a single diffraction grating to determine the values of:

$$SbO_1 = k(OV+D) + \in$$

$$SbO_2 = k(OV-D) + \in$$

$$SbO_3 = \in$$

in same manner as described further above. The calibration will also provide the sign of the overlay error.

In some instances it may be preferred to use less diffraction gratings in order to calibrate the substructure. One way in which this can be done is to determine the constant k that links the shift between orders to the overlay, by reconstructing the shape of the substructure of the product layer diffraction grating 100 and the resist layer diffraction grating 101 (k is dependent upon the substructure). The reconstruction is performed in two parts. In the first part, the product layer diffraction grating is measured before the resist layer diffraction grating has been imaged into the resist. The measurement is made using the metrology unit shown in FIGS. 3 and 4, or alternatively using the metrology unit described below in relation to FIG. 23. The measurement is performed for a plurality of wavelengths (additional wavelength channels may be added to the metrology unit shown in FIGS. 3 and 4 for this purpose). The results of the measurement are used to reconstruct the shape of the substructure of the product layer diffraction grating using known 'inverse scattering' techniques currently used in critical dimension scatterometry. Suitable inverse scattering techniques are described in U.S. Pat. No. 6,563,594 and U.S. Pat. No. 6,559,924.

The second part of the reconstruction is to reconstruct the shape of the substructure of the resist layer diffraction grating. The resist layer diffraction grating is measured using one of the above mentioned metrology units for a plurality of wavelengths, and the results are used to reconstruct the shape of the substructure of the resist layer diffraction grating using inverse scattering techniques. Overlay between the resist layer diffraction grating and the product layer diffraction grating will have a negligible effect on the reconstruction, making the reconstruction robust. If overlay is found to introduce unacceptable errors, then a second resist layer diffraction grating (with identical substructure) may be imaged adjacent the first resist layer diffraction grating. The substructure of this diffraction grating can be reconstructed without overlay errors being introduced. An alternative method of determining the substructure is to use a separate measurement performed for example using an atomic force microscope.

Once the substructures of the product layer diffraction grating and the resist layer diffraction grating have been reconstructed, these are used together with knowledge of the separation of the layers to calculate the constant k. The calculation may be performed using a known electromagnetic solver, for example G-Solver or Tempest. Once k has been determined the overlay can be calculated using the shift between orders. An advantage of the reconstruction based calibration method is that it requires less diffraction gratings than the calibration method described further above, thereby leaving more space for other structures. A further advantage of the calibration method is that, since it reconstructs the substructures of the diffraction gratings, it yields directly measurements of the critical dimension.

Figure 15:
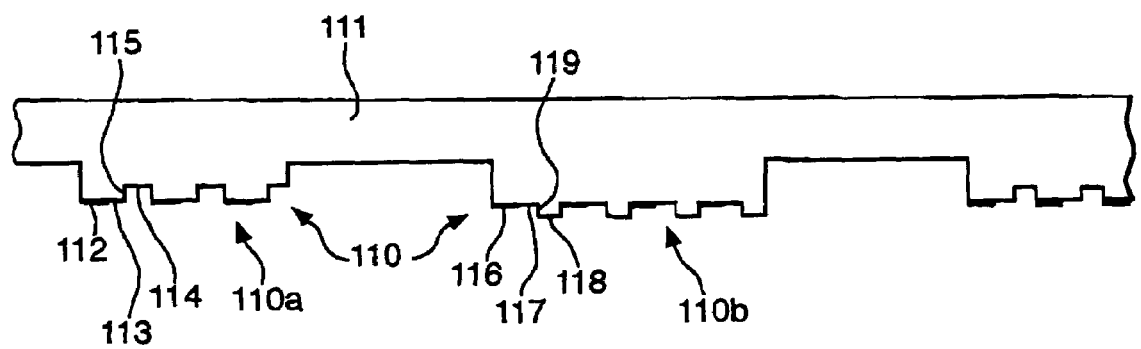
FIGS. 15 to 18 depict schematically a metrology diffraction grating used in an alternative method according to the present invention, together with results obtained using that diffraction grating.

In a further alternative embodiment of the invention an asymmetry is provided in a marker comprising a single diffraction grating by including on the diffraction grating bearing mask (MA in FIG. 1) substructures each provided with a step in optical path length of $$\frac{\lambda}{4},$$

for example as shown in FIG. 15. Referring to FIG. 15, three lines of a diffraction grating 110 on a mask 111 are shown. A first line 110a of the diffraction grating is provided with substructures each of which comprises a non-transmissive portion 112, and first and second transmissive portions 113, 114. A step 115 is located between the first transmissive portion 113 and the second transmissive portion 114. The step is such that the optical path length of light which passes through the first portion 113 is $$\frac{\lambda}{4}$$

greater than the optical path length of light which passes through the second portion 114.

A second line 110b of the diffraction grating is provided with substructures each of which comprise a non-transmissive portion 116, and first and second transmissive portions 117, 118 separated by a step 119. The step is opposite in phase compared with the step 115 of the first line 110a of the diffraction grating. This means that the optical path length of light which passes through the first portion 117 is $$\frac{\lambda}{4}$$

less than the optical path length of light which passes through the second portion 118.

Subsequent lines of the diffraction grating are provided with the same substructures in an alternating pattern.

The effect of the λ/4 steps is that, at the wafer surface, each line of the diffraction grating is displaced if the diffraction grating is not correctly focussed (this effect is described in U.S. Pat. No. 6,674,511, incorporated herein by reference). The displacement is dependent upon the direction of the step. This means that adjacent lines of the diffraction grating are displaced in opposite directions as a result of defocus.

Figure 16:
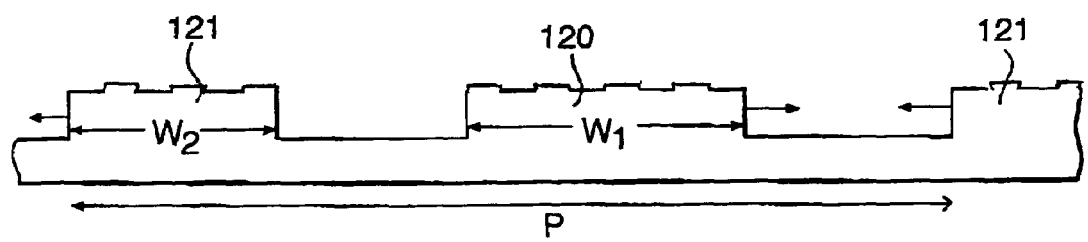

The effect of the substructures on a wafer is shown schematically in FIG. 16. For ease of illustration the dimensions of the diffraction grating of FIG. 16 correspond to the dimensions of the diffraction grating of FIG. 15; however in practice the dimensions of the diffraction grating of FIG. 16 will be one quarter those of FIG. 15. Three lines of a diffraction grating are shown in cross-section in FIG. 16. The diffraction grating has a period P which is of the order of 10 microns. The diffraction grating comprises lines 121 that have been imaged through a mask having a positive phase shift of $$\frac{\lambda}{4},$$

alternating with lines 120 that have been imaged through a mask having a negative phase shift of $$\frac{\lambda}{4}.$$

In the example shown in FIG. 16, defocusing will cause one line 120 to move to the right whereas the lines 121 on either side will move to the left.

The substructures on the mask 111 are imaged as substructure on the lines 120, 121 of the diffraction grating. However, the substructures generate only zero diffraction orders and to first order can therefore be approximated as though they behave as plane surfaces with a complex reflection coefficient.

The asymmetry is measured by the metrology unit by comparing the displacement caused by the defocusing for different orders of diffraction and/or for different wavelengths (as previously mentioned, for ease of terminology this shift is referred to as the shift between orders or SbO). Without defocus the displacement caused by the substructures is zero, and the diffraction grating is perfectly symmetric, giving a zero shift between orders (SbO). However, defocus introduces asymmetry, the lines 120 and 121 being displaced in opposite directions over a distance Ax. This asymmetry shows up as a shift between orders that can be measured with the metrology unit as described below.

The sensitivity of the focus metrology can be tuned using the width of the lines 120, 121 of the diffraction grating, indicated as $W_1$ and $W_2$ respectively. It is shown that sensitivity can be made very large at the expense of signal strength. The widths $W_1$ and $W_2$ can be represented as a combination of an average part and a differential part:

$$W_1 = \overline{W} + \Delta W$$

$$W_2 = \overline{W} - \Delta W$$

Figure 17:
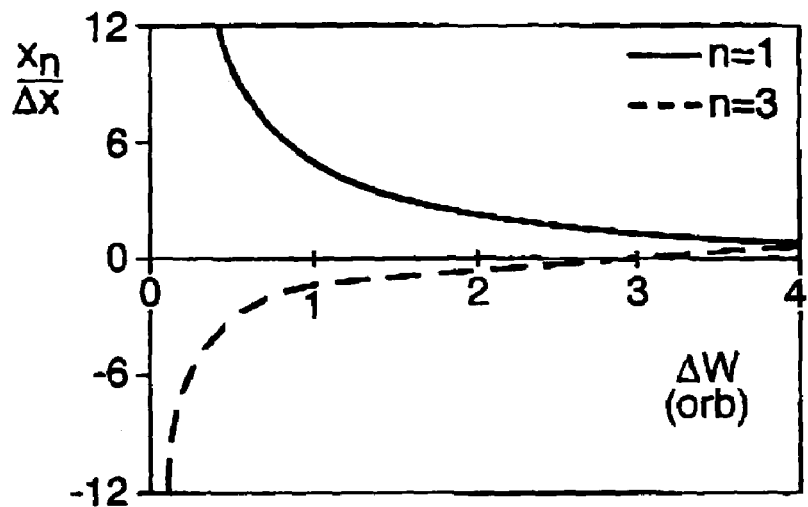

FIG. 17 shows the calculated sensitivity (i.e. the ratio of the measured shift to the real shift) as a function of ΔW for the $1^{st}$ and $3^{rd}$ order.

For small values of ΔW the measured shift between orders is very large. Moreover, the $1^{st}$ and $3^{rd}$ orders move in opposite directions, which increases the shift between orders even further. For ΔW=4 (arbitrary units) the sensitivity becomes 1 for both orders and the shift between orders becomes therefore zero. This is not surprising since this case corresponds to the situation where the lines 121 have effectively vanished, so that the entire diffraction grating remains symmetric in the presence of defocus.

Figure 18:
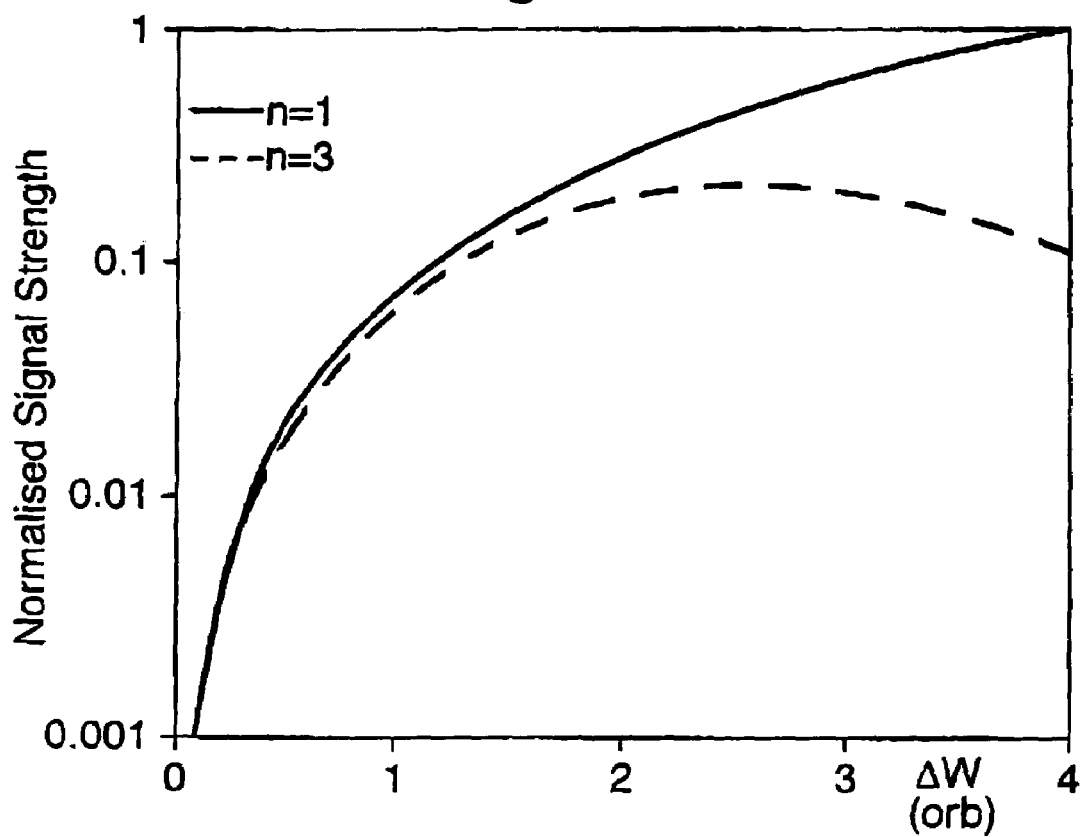

At first sight it may seem tempting to choose small values of ΔW. However, there is a price to pay: the strength of the detected signal decreases as ΔW is reduced. FIG. 18 shows the normalized detected signal strength as a function of ΔW for the $1^{st}$ and $3^{rd}$ diffraction order. Here the signal strength has been normalized. At the same time, when the signal strength becomes very small, reticle write errors and surface roughness may limit the accuracy. The fact that the signal strength rapidly decreases for small values of ΔW is intuitively understandable since when ΔW is small the diffraction grating starts to behave as a diffraction grating with a period of P/2 instead of P (the metrology unit is configured to detect diffraction from a grating with a period of P). However, to some extent this can be compensated by making use of the large dynamic range of the phase diffraction grating detection used by the metrology unit, for example if it is assumed that a signal loss of a factor of 10 is acceptable (normalised signal strength=0.1).

It will be appreciated that it is not necessary that every period of the diffraction grating is provided with the above described substructures. All that is required is sufficient amounts of substructures to allow the shift between orders to be measured with a desired accuracy.

To first order, the shift between orders is insensitive to stage drift and stage vibrations so this method is particularly useful for low quality scanning stages.

In a further embodiment of the invention a marker is provided with an asymmetry that is sensitive to the critical dimension (CD) of patterns exposed on a wafer (critical dimension refers to the resolution of features exposed on the wafer). The asymmetry is measured using a method based upon a metrology marker which comprises three different regions, shown in FIG. 19. The regions are an unexposed (i.e. raised, line) region 150, a region having a substructure 151, and an exposed (i.e. recessed, space) region 152. The three regions together form one period of an asymmetric phase diffraction grating 154 which has a period of 4P (where P is of the order of microns). The substructure 151 has a period which is comparable to the limit of resolution of the lithographic projection apparatus; in this case this is set at P/5 for ease of illustration. The unexposed region 150 and exposed region 152 both have a width of P, whereas the substructure region 151 has a width of 2P.

Referring again to FIG. 19, the diffraction grating provided can be seen to be asymmetric. Furthermore, the asymmetry of the diffraction grating changes as a function of CD. The asymmetry is accurately detected as a shift between orders (as previously discussed this may be a shift between diffraction orders and/or between wavelengths) by the metrology unit of FIGS. 3 and 4, thereby providing a measurement of the CD.

Figure 19:
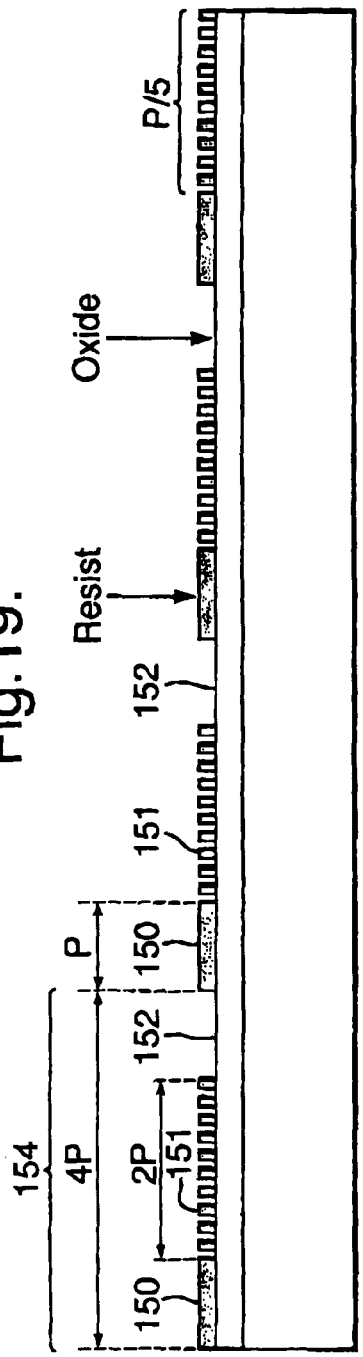
FIGS. 19 and 20 depict schematically a metrology diffraction grating and metrology unit used in an alternative method according to the present invention.

The effect of a change of CD can be understood intuitively with reference to FIG. 19. If the CD were to improve to for example P/12.5 (ΔCD=−P/50), then the width of each line of the substructure 151 will be narrowed. This would lead to the 'centre of gravity' of the diffraction grating (i.e. the centre of the diffraction grating as measured by the metrology unit) being moved to the left. In other words, the substructure diffracts less light to the detector whereas the amount of light diffracted by the line 150 is unchanged, so that the centre of intensity of diffracted light is moved towards the line 150 (i.e. moved to the left). The amount of movement of the centre of gravity of the diffraction grating 154 is dependent upon the diffraction order and the wavelength of the light diffracted from the diffraction grating 154. This means that, provided that a calibration of the relative movements for different orders (or wavelengths) has been performed, a measurement of CD is obtained by looking at the shift between orders (or wavelengths).

Figure 20A:
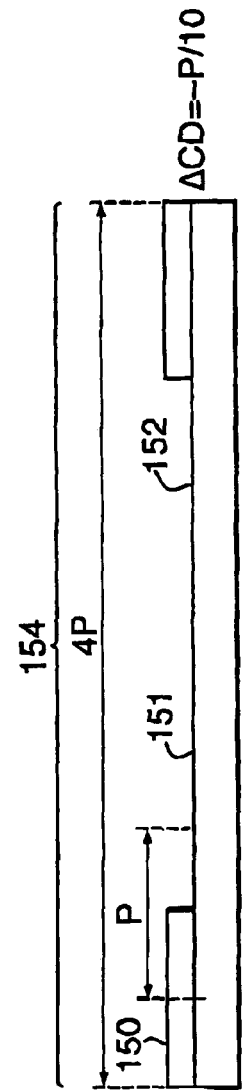
Figure 20B:
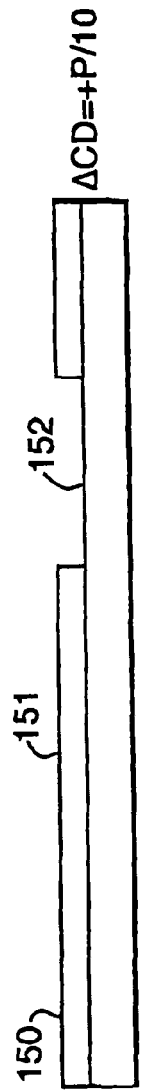

An extreme instance of the intuitive example is shown in FIG. 20. Referring to FIG. 20a, a CD of zero (ΔCD=−P/10) will lead to no substructure being present such that the centre of gravity of the diffraction grating 154 will be measured as the centre of the line 150 of the diffraction grating. FIG. 20b shows the opposite extreme. A CD of P/5 (ΔCD=+P/10) will lead to the substructure 151 merging such that the centre of gravity of the diffraction grating 154 will be measured as the midpoint between the beginning of the line 150 and the end of the merged substructured region 151. Thus, a change of CD of P/5 will be seen as a shift of P by the metrology unit.

It should be noted that the configuration of the diffraction grating 154 shown in FIGS. 19 and 20 is just an example. In practice, many different configurations are possible, as will be apparent to the skilled reader. The sign of the asymmetry introduced by the substructure is dependent upon whether positive resist or negative resist is used. The example shown in FIG. 20 is for a positive resist.

Figure 21:
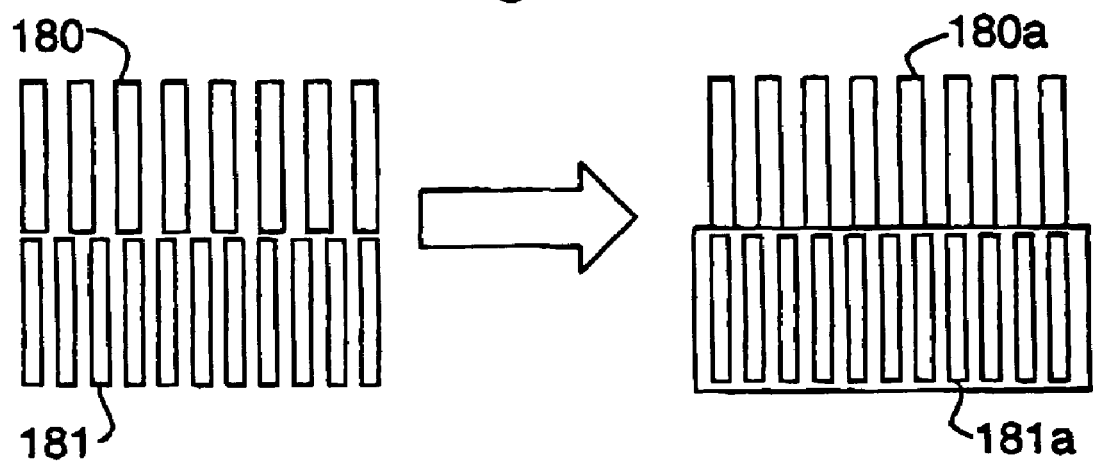
FIGS. 21 and 22 depict schematically a metrology diffraction grating used in an alternative method according to the present invention.

In a further embodiment of the invention, a shift between orders is used to measure an asymmetry which is sensitive to the effect of processing on patterns imaged on a wafer. The method, which relies on clearing part of a marker from process effects, is shown schematically in FIG. 21. A marker comprising two diffraction gratings 180, 181 is exposed in a resist layer of a wafer (the marks are viewed from above in FIG. 21). The first diffraction grating has a first period (P/N), and the second diffraction grating has a second period (P/M). The wafer is processed in the conventional manner. Subsequently, the processing is cleared from the second diffraction grating. This is done by applying a layer of resist to the wafer, exposing the region of the second diffraction grating, developing and etching that region and stripping it of resist. The marker then comprises a first processed diffraction grating 180a and a second diffraction grating 181a, from which the effects of processing have been removed. The relative locations of the first and second diffraction gratings 180a, 181a are measured using the shift between orders method described above in relation to FIGS. 7 and 8. This gives a measurement of the effect that the processing has on the processed diffraction grating, and can be used to correct alignment based upon other processed diffraction gratings.

Figure 22:
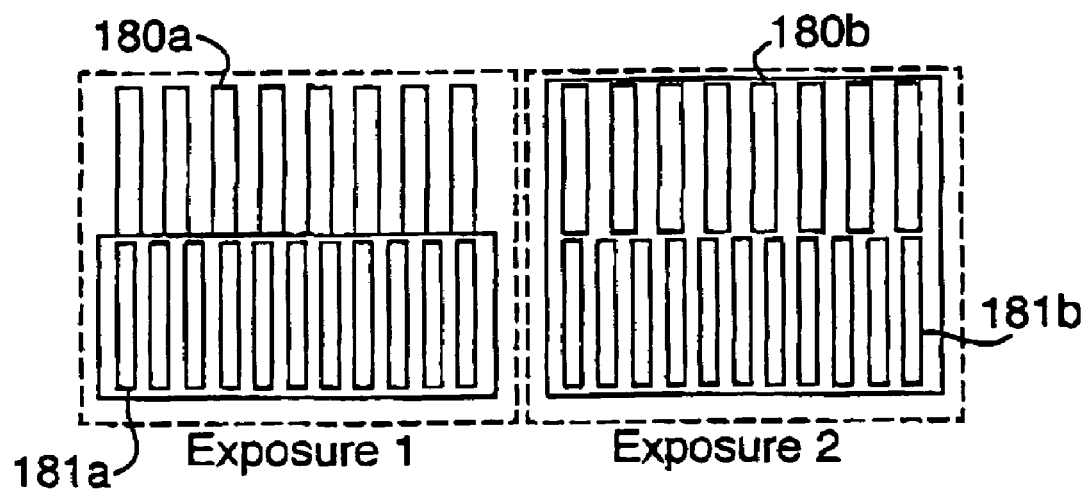

This embodiment of the invention may suffer from imaging errors, or errors arising from different detected orders (or colours) giving different position measurements. In order to correct for this an additional marker may be exposed as shown in FIG. 22. The left hand marker comprises diffraction gratings 180a, 181a which correspond to those in FIG. 21. The right hand marker is exposed using the same mask (see FIG. 1) that was used to expose the left hand marker (this is to avoid errors arising from the mask). However, in the right hand marker both diffraction gratings 180b, 181b have been cleared of processing effects. The right hand marker is used to provide a shift between orders measurement which is used to correct errors in the measurement made for the left hand marker.

Figure 23:
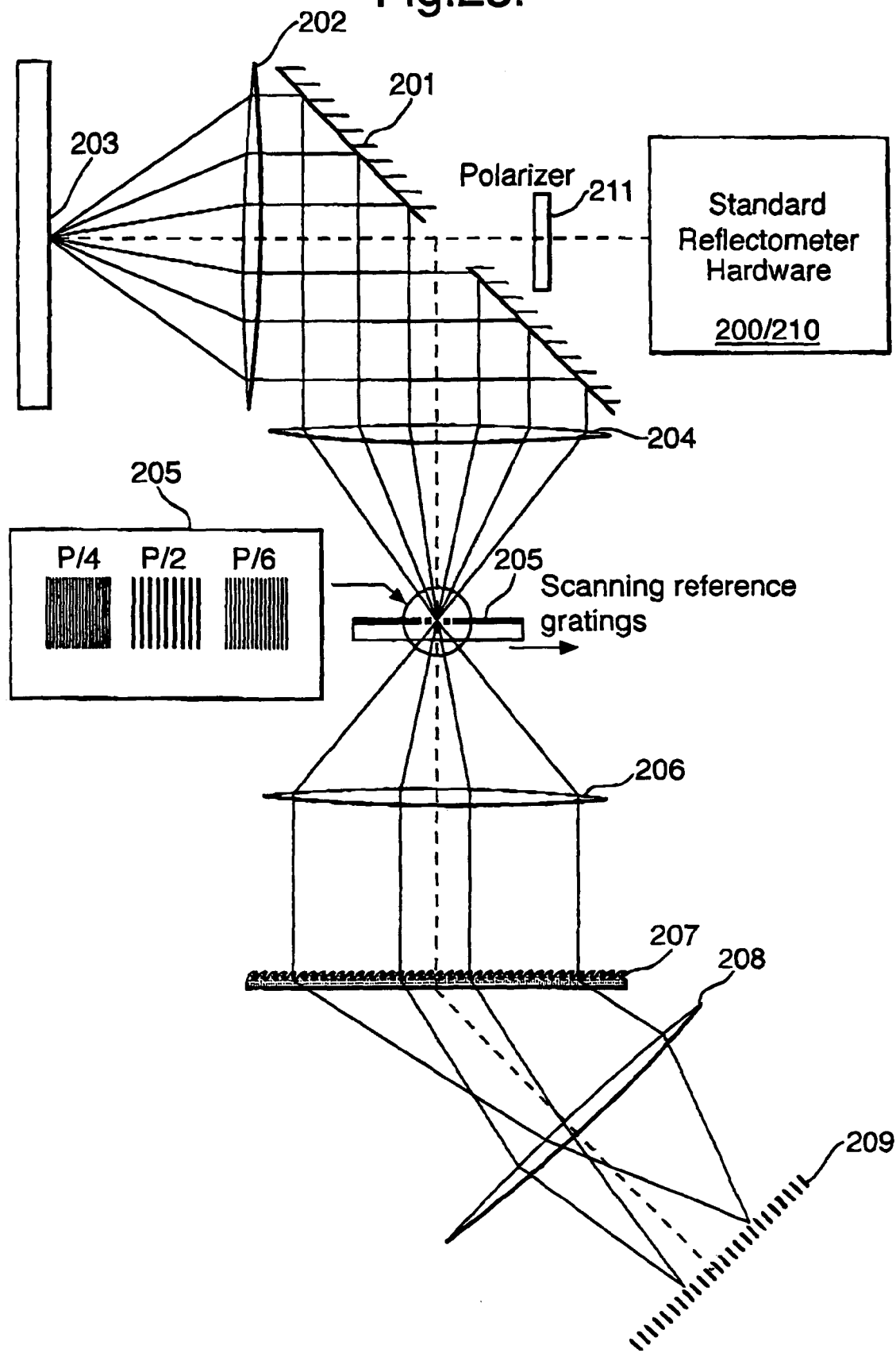
FIG. 23 depicts schematically an alternative metrology unit which may be used according to the invention.

An alternative metrology unit that may be used to measure asymmetry, and hence critical dimension or other properties is shown in FIG. 23. A broadband coherent light source 200 (e.g. a broadband laser) generates a collimated beam of light which passes through an opening in a 45 degree mirror 201, and is focussed by a lens 202 onto a diffraction grating 203 (the diffraction grating is of the type shown in FIGS. 19 and 20). Light diffracted by the diffraction grating 203 is collimated by the lens 202, reflected by the 45 degree mirror and focused by a second lens 204 onto a set of scanning transmissive reference diffraction gratings 205. Light which passes through the transmissive reference diffraction gratings 205 is collimated by a third lens 206 onto a spectrometer diffraction grating 207. The spectrometer diffraction grating 207 diffracts the light at angles determined by the wavelength of the light. The diffracted light is focussed by a fourth lens 208 onto a detector array 209. In a preferred embodiment, as shown, the metrology unit further comprises conventional reflectometer hardware 210 and a polariser 211 used to control the linear polarisation of the light passing to the diffraction grating 203. The conventional reflectometer hardware 210 is well known to those skilled in the art, and therefore is not described here. The 0-th order of light scattered by the diffraction grating 203 is retro-reflected and passes to the standard reflectometer hardware. This light is detected and processed in a manner that is analogous to regular reflectometers.

It will be seen from FIG. 23 that three scanning transmissive reference diffraction gratings 205 are provided adjacent one another. This is done to allow the measurement of different diffraction orders at the detector array 209.

Figure 24:
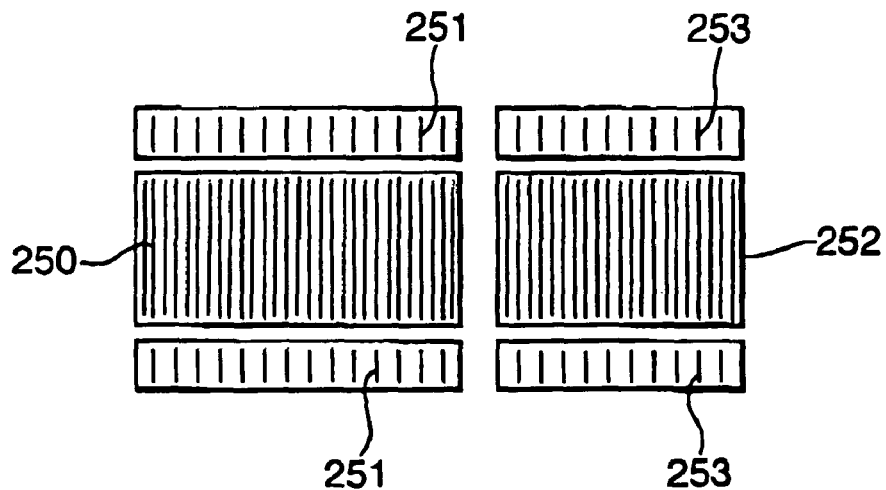
FIGS. 24 to 26 depict schematically an alignment and metrology method according to the invention.

The above described embodiments of the invention may be used individually or in combination. Furthermore, a given marker may be used for alignment, and then subsequently used for metrology. The following description in relation to FIGS. 24 to 26 comprises examples of such methods:

Referring to FIG. 24, a marker (viewed from above) in a process layer on a wafer comprises a diffraction grating 250 of a first period (P/N) arranged to be preferentially detected by a particular detector of the metrology unit shown in FIGS. 3 and 4 (or particular detectors if more than one wavelength is used). An alignment unit measures the location of the diffraction grating, which is used to determine the aligned position for imaging of a subsequent layer onto the wafer. The alignment unit may comprise the same apparatus as the metrology unit, for example as shown in FIGS. 3 and 4, the manner in which the detected signal is used being different (the terms alignment unit and metrology unit are interchangeable in this part of the description).

The subsequently imaged layer includes two diffraction gratings 251 of a second period (P/M) located on either side of the first diffraction grating. These second diffraction gratings are arranged to be preferentially detected by a different particular detector (or detectors) of the metrology unit than is used to detect the first diffraction grating. The three diffraction gratings 250, 251 in combination form an asymmetric marker (assuming that overlay is not perfect), which can be used to measure overlay as described above in relation to FIGS. 7 to 12.

Following processing of the layer having the second diffraction gratings, the second diffraction gratings may be used to determine the aligned position for imaging of a further layer onto the wafer.

The second diffraction gratings 251 may optionally be accompanied by an additional diffraction grating 252 located adjacent the first diffraction grating. The additional diffraction grating has the period (P/N), and may be used to determine the aligned position for imaging of the further layer onto the wafer. The additional diffraction grating may also be used to measure overlay in a manner analogous to that described above, if the further layer includes appropriately positioned diffraction gratings 253 having an appropriate period.

Figure 25:
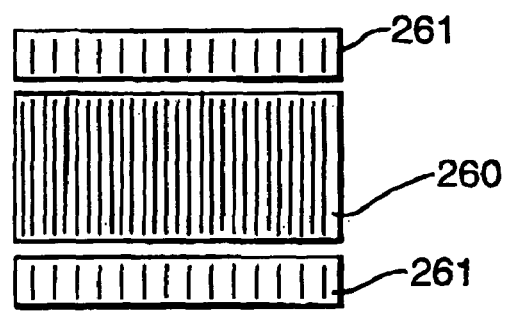

The invention can be used to provide a measurement of asymmetry caused by processing using a marker of the type shown in FIG. 25. Referring to FIG. 25, a marker comprises a central portion comprising a diffraction grating 255 having a first period (P/N) sandwiched between second portions comprising diffraction gratings 256 having a second longer period (P/M) (the marker is viewed from above). The marker allows measurement of the shift between orders seen for different grating periods, which in turn allows measurement of the asymmetry caused by processing. The entire target is imaged and processed for one layer (i.e. the diffraction gratings are not located in different layers). The longer period (P/M) is more affected by asymmetric processing than the shorter period (P/N). The relationship between the shift between orders and the asymmetry of the processing may be calibrated in advance using wafers which undergo processing having different asymmetries, and stored to quantify the asymmetry which gives rise to a particular shift between orders. The target may comprise additional diffraction gratings which may be used to increase the accuracy to which the asymmetry can be quantified, for example by generating several shift between order measurements which may be compared with stored calibration data.

Figure 26:
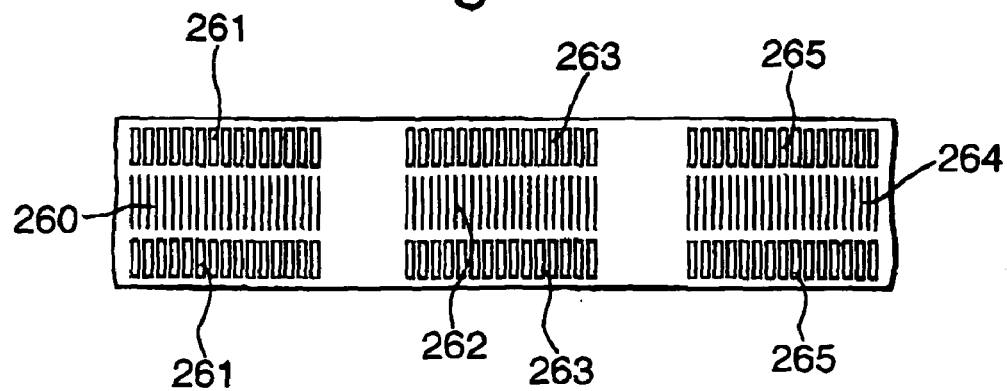

The embodiment described in relation to FIG. 25 may be combined with the embodiment described in relation to FIG. 24, as shown in FIG. 26. In this embodiment a first target comprises a central portion comprising a diffraction grating 260 having a first period (P/N) sandwiched between second portions comprising diffraction gratings 261 having a second longer period (P/M). The diffraction gratings 260, 261 are located in a process layer, and may be used to measure processing asymmetry as described above. Also in the process layer, an additional diffraction grating 262 having the first period (P/N) is located adjacent to the first target. Diffraction gratings are subsequently imaged into a resist layer. Diffraction gratings 263 of the second period (P/M) are located either side of the additional process layer diffraction grating 262. Together these form a target which may be used to measure overlay using the shift between orders as described above (this target is referred to as the overlay target). A third target comprising a central portion comprising a diffraction grating 264 having a first period (P/N) sandwiched between second portions comprising diffraction gratings 265 having a second period longer (P/M) is also imaged into the resist layer. This third target may be used to correct for sensor errors (see above).

It will be appreciated that other combinations of the above described embodiments of the invention may be used to obtain desired combinations of metrology measurements and/or metrology and alignment measurements.

The overlay metrology embodiments of the invention described above are described in terms of an asymmetric marker which is measured using a metrology unit. Typically, the metrology unit is used after development and baking of the resist on a wafer (S8 in FIG. 2), the metrology unit being located some distance away from the lithographic projection apparatus (wafers may be carried from the lithographic projection apparatus to a metrology unit via a conveyor known as a track). However, it will be appreciated that the invention may be used to obtain overlay metrology measurements at other stages of the lithographic process cycle, and that the metrology unit may have an alternative location. For example, the metrology unit may be located within the lithographic projection unit and used to obtain metrology measurements, for example overlay measurements for two previously processed product layers, or for a product layer and a resist layer bearing latent images (the metrology unit may be the same unit that is used to measure alignment).

In order to obtain metrology measurements for two previously processed product layers, i.e. after etching and/or processing, the two layers are for example provided with diffraction gratings provided with some form of asymmetry (the asymmetry may be in any of the forms described above). A layer of resist is applied to the wafer in the conventional way, to allow exposure of a new layer, and the wafer passes to the lithographic projection apparatus. Prior to exposure of the new layer the metrology unit is used to obtain metrology measurements via the asymmetry present in the diffraction gratings, using one or more of the methods described above. It will be appreciated that the metrology measurements may be obtained after exposure. Conveniently, the metrology unit may comprise a unit which is also used to obtain alignment information for the subsequent exposure (i.e. separate metrology and alignment units are not required). It will be appreciated that overlay metrology measurements for several preceding product layers may be obtained, via comparison of diffraction gratings having an appropriate asymmetry. In general terms, prior to exposure of layer n+1, marks exposed in previous layers n, n−1 (or n−2, . . . , n−m) can be measured, allowing overlay metrology between layers n and n−1 (or n−2, . . . , n−m and combinations thereof).

Conveniently, the overlay metrology measurements may be obtained during alignment of the wafer for exposure, i.e., when the alignment unit is located over a given alignment diffraction grating for alignment purposes, it may obtain a first measurement based solely upon that diffraction grating in order to provide alignment, and may obtain a second measurement based upon a diffraction grating located in a layer above or beneath the alignment diffraction grating (or based upon a combination of both diffraction gratings) the second measurement being used to provide overlay metrology measurements. Where a dual stage lithographic apparatus is used (i.e., the wafer is mapped in a separate stage prior to exposure, as described for example U.S. Pat. No. 6,674,510 the overlay metrology measurement may be performed without any reduction of productivity.

Using the method in this way is advantageous because it allows overlay metrology measurements to be performed for every wafer, thereby minimizing the possibility that a non-yielding wafer or die is not detected. This is favorable compared to conventional arrangements in which overlay metrology measurements are performed for only a representative sample of wafers. The overlay metrology data provided may be used to provide an estimation of corrections to be applied to subsequent wafers of a batch for a given resist layer n (feedback). In addition, in instances where processing steps are comparable, the metrology data may be used to provide an estimation of corrections to be applied to subsequent layers (feedforward).

Overlay metrology which embodies the invention may be performed for latent images. The latent images may be images which have been exposed in resist, i.e. without post exposure bake. However, in some instances it may not be possible to resolve such images, in which case a post exposure bake may be used.

In addition to overlay metrology the invention may be used, as described above, to provide focus metrology, critical dimension metrology and other metrology. Where this is done the measurement may be performed for a marker in a process layer or a marker in a resist layer. The metrology measurements may be performed for latent images before or after post exposure bake. The metrology unit may be in any of the locations mentioned above.

It is known from the art that it is not necessary to use a diffraction grating in order to obtain diffraction. Diffraction may be obtained by directing illumination onto a suitably dimensioned single feature (typically the feature is of the order of the wavelength of the illumination) or other suitably dimensioned marker. The use of diffraction gratings is preferred for the described embodiments of the invention because they provide strong diffraction signals. However, it will be appreciated that the invention may be implemented using markers which are not diffraction gratings. For example, consider the embodiment of the invention described in relation to FIG. 5. The marker shown comprises four lines of a product diffraction grating and four lines of a resist diffraction grating. If three lines of each diffraction grating are removed from the marker, then the marker will comprise a single line in the resist layer located over a single line in the product layer. Light directed at the marker will be diffracted by the marker. Different diffraction orders and/or wavelengths will be detected by the metrology unit. Differences in the position of the marker as measured for different diffraction orders and/or wavelengths may be used to measure overlay, in the manner described further above.

It will be appreciated that other embodiments of the invention which have been described in relation to diffraction gratings may also be implemented using single features or other suitably dimensioned markers.

What is needed in order for the invention to function correctly is markers which include some degree of asymmetry. If a marker is entirely symmetric then it will not provide metrology according to the invention. The following is a mathematical explanation of why the asymmetry is required:

Consider an isolated feature marker that is symmetric around a position $x_0$ and is illuminated with a light beam that is also symmetric around $x_0$. By virtue of symmetry considerations, the near-field that is created by this configuration must also show the same type of symmetry around $x_0$:

$$E_e^{(nf)}(x-x_0;\lambda)=E_e^{(nf)}(-x-x_0;\lambda)$$

Here the dependency of the near field on the wavelength $\lambda$ is explicitly indicated. For simplicity only 1 dimension (x) is considered, but an extension to 2 dimensions, however, can easily be made. The propagation of the field defined above obeys the wave equation for homogeneous media. The resulting field distribution that is very far away from the scattering marker is called the far-field. It is shown in various text books on this subject [e.g. J. W. Goodman; Introduction to Fourier Optics; McGraw-Hill;] that this far-field is the Fourier transform of the near field. Again by virtue of symmetry, this far-field must also possess symmetry:

$$E_e(\theta;\lambda,x_0)=E_e(-\theta;\lambda,x_0)$$

$$|E_e(\theta;\lambda,0)|\exp[j\varphi_e(\theta;\lambda)]\exp\left[-2\pi j\frac{\sin(\theta)}{\lambda}x_0\right]=$$
$$|E_e(-\theta;\lambda,0)|\exp[j\varphi_e(-\theta;\lambda)]\exp\left[2\pi j\frac{\sin(\theta)}{\lambda}x_0\right]$$

$$|E_e(\theta;\lambda,0)|\exp[j\phi_e(\theta;\lambda)]\exp[-jkx_0]=|E_e(-\theta;\lambda,0)|\exp[j\phi_e(-\theta;\lambda)]\exp[jkx_0]$$

where the subscript 'e' denotes an even function of the far-field angle $\theta$, and $k=2\pi\sin(\theta)/\lambda$ is called the spatial angular frequency. The $2^{nd}$ expression in the equations above merely uses the Fourier shift theorem: A shift in the space domain results in a linear phase shift in the frequency domain. In other words, a symmetric marker always has a symmetric amplitude of the far-field. Moreover, the phase $\phi_e$ of the far-field is also symmetric and the only anti-symmetric component that can exist is a linear phase shift that is introduced by a displacement of the marker.

Note that this treatment is valid for diffraction gratings and isolated objects. It is basically a mathematical formulation of an optical alignment sensor concept. Basically, existing optical alignment sensors compare the phase difference between a selected range of negative spatial frequencies $[-k_1 \ldots -k_2]$ and a corresponding range of positive spatial frequencies $[k_2 \ldots k_1]$. This phase difference is only a function of $x_0$ and independent of the even phase difference $\phi_e$. This measurement is suitable for alignment, but does not provide metrology measurement.

The embodiments of the invention rely on the fact that the metrology unit measures the apparent position of an asymmetric (composite) diffraction grating for different orders/colors. A common factor in these embodiments is the fact that the diffraction grating asymmetry is a (non-linear) function of the metrology parameter that needs to be measured (Overlay, CD, lens aberration, . . . ).

The near field created by an asymmetric marker at position $x_0$ is generally also asymmetric. Mathematically, we can always decompose this near field in a symmetric (=even) and an anti-symmetric component (=odd):

$$E^{(nf)}(x-x_0;\lambda) = E_e^{(nf)}(-x-x_0;\lambda) + E_0^{(nf)}(-x-x_0;\lambda)$$

Here the subscripts 'e' and 'o' denote, respectively, even and odd complex functions with the property:

$$f_e(x) = f_e(-x)$$

$$f_o(x) = -f_o(-x)$$

Fourier transforming this near field, and using the linearity of a Fourier transform results in a far field that also consists of a symmetric (=even) and an anti-symmetric (=odd) part:

$$E(\theta;\lambda,x_0) = E_e(\theta;\lambda,x_0) + E_o(-\theta;\lambda,x_0)$$

$$E(\theta; \lambda, 0) =$$
$$\{|E_e(\theta; \lambda, 0)|\exp[j\varphi_e(\theta; \lambda)] + |E_o(\theta; \lambda, 0)|\exp[j\varphi_o(\theta; \lambda)]\}\exp\left[2\pi j \frac{\sin(\theta)}{\lambda}x_0\right]$$

$$E(\theta;\lambda,0) = \{|E_e(\theta;\lambda,0)|\exp[j\phi e(\theta;\lambda)] + |E_o(\theta;\lambda,0)|\exp[j\phi_o(\theta;\lambda)]\}\exp[jkx_0]$$

According to the above-mentioned property of odd complex functions the phase and amplitude terms obey:

$$|E_{e,o}(\theta;\lambda,0)| = |E_{e,o}(-\theta;\lambda,0)|$$

$$\phi_e(\theta;\lambda) = \phi_e(-\theta;\lambda)$$

$$\phi_o(\theta;\lambda) = \phi_o(-\theta;\lambda) + \pi$$

Before proceeding with a practical interpretation of this rather abstract analysis, it is worthwhile to emphasize that this analysis is valid for any marker. Moreover, the even and odd phase terms $\phi_e$ and $\phi_o$ are a function of the spatial frequency (=far-field angle $\theta$) and the wavelength $\lambda$ (i.e. differences between the terms will be seen by measuring a shift between orders).

Figure 27:
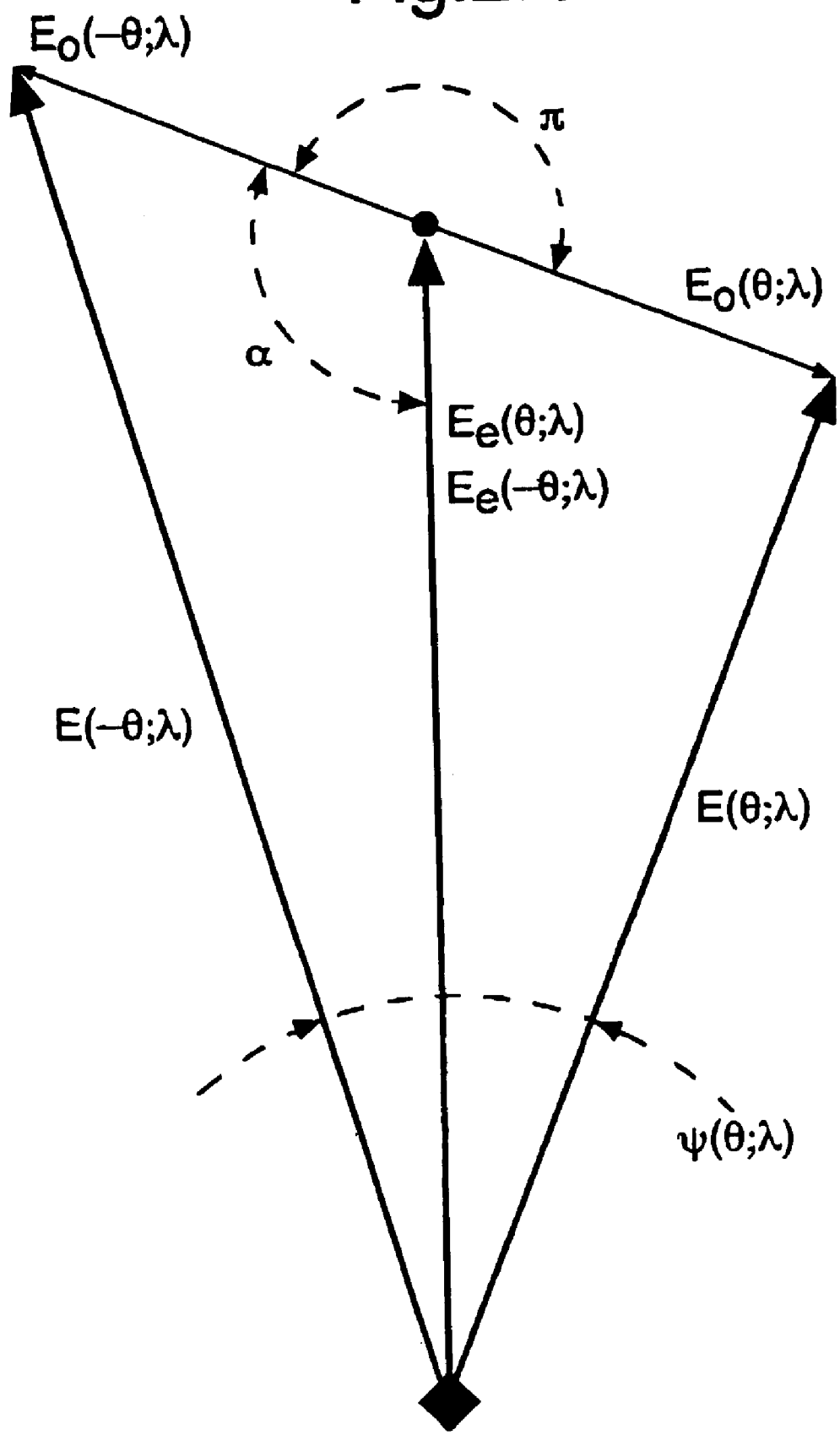
FIG. 27 shows schematically how the invention may be implemented without using diffraction gratings.

FIG. 27 shows a graphical interpretation for the situation when $x_0=0$ (i.e. the object is at its defined location). In that case the complex amplitudes of the symmetric part of the diffracted fields at 2 far-field angles $\theta$ and $-\theta$ are equal but depend on the chosen angle and the wavelength. The anti-symmetric complex fields are also shown in FIG. 27 and their amplitudes and phase $\alpha$ relative to the even part also depend on the far-field angle and the wavelength.

The metrology unit does not distinguish between a symmetric and an anti-symmetric part of the far-field. It only measures the total field, which is the vectorial sum of the even and odd fields shown in FIG. 27. In general terms, the metrology unit measures the phase difference $\psi$ (see FIG. 27) between mirrored spatial frequencies (or equivalently: far-field angles). The vectorial construction clearly shows that this will depend on the magnitudes and relative phases of the even and odd parts of the spectrum. Generally, a change in the asymmetry of the marker will change the even and odd parts of the far field. This change is wavelength/far-field angle dependent, which results in a measurable position:

$$x_m(k, \lambda) = x_0 + \frac{\psi(k, \lambda)}{2} \frac{1}{k}$$

Here the subscript 'm' indicates that it concerns a 'measured' position which consists of 2 terms: the "true" position $x_0$ and the asymmetry offset. The true position is independent of wavelength and spatial frequency so we can eliminate this unknown term by measuring the position for 2 different colors and/or spatial frequencies ("diffraction orders" in case of diffraction gratings):

$$\Delta x(k_1, k_2, \lambda_1, \lambda_2) = \frac{\psi(k_1, \lambda_1)}{2k_1} - \frac{\psi(k_2, \lambda_2)}{2k_2}$$

Note that the vectorial construction shows that the contrast (i.e. the amplitude difference) could also be used. This, however, is not preferred since the asymmetry effects are generally quite small which leads to contrasts that deviate only slightly from unity.

What is claimed is:

1. A method of device inspection, the method comprising: providing an asymmetric marker on a device to be inspected, the form of asymmetry of the marker being dependent upon the parameter to be inspected; directing light at the marker; obtaining a first measurement of a position of the marker via detection of diffracted light of a particular wavelength or diffraction angle; obtaining a second measurement of the position of the marker via detection of diffracted light of a different wavelength or diffraction angle; and comparing the first and second measured positions to determine a shift indicative of the degree of asymmetry of the marker.

2. A method according to claim 1, wherein the first and second position measurements comprise detection of diffracted light having different diffraction angles but the same wavelength.

3. A method according to claim 1, wherein the first and second position measurements comprise detection of diffracted light having the same diffraction angle but different wavelengths.

4. A method according to claim 1, wherein the first and second position measurements comprise detection of diffracted light having different diffraction angles and different wavelengths.

5. A method according to claim 1, wherein the first and second position measurements are performed simultaneously.

6. A method according to claim 1, wherein the marker comprises one or more diffraction gratings.

7. A method according to claim 6, wherein the one or more diffraction gratings are phase diffraction gratings.

8. A method according to claim 6, wherein the marker comprises a first diffraction grating provided in a first layer of the device, and a second diffraction grating provided in a second layer of the device, the first diffraction grating and the second diffraction grating having a same period and being provided one over the other such that the light is diffracted by both of the diffraction gratings in combination, measured asymmetry between the diffraction gratings indicating overlay of the first and second layers.

9. A method according to claim 8 wherein lines of the first diffraction grating are narrower than lines of the second diffraction grating.

10. A method according to claim 8, wherein the shift is used to determine the overlay of the first and second layers.

11. A method according to claim 10, wherein the overlay is calibrated by using third and fourth diffraction gratings provided in the first and second layers, respectively, the third and fourth diffraction gratings being provided adjacent the first and second diffraction gratings.

12. A method according to claim 11, wherein an overlay offset of a first sign is provided between the first and second diffraction gratings, and an overlay offset of an opposite sign is provided between the third and fourth diffraction gratings.

13. A method according to claim 12, wherein the magnitudes of the offsets are of the order of the largest desired overlay measurement.

14. A method according to claim 13, wherein the offsets are of the order of 100 nm.

15. A method according to claim 11, wherein the overlay calibration is used to calibrate overlay measurements obtained using further diffraction gratings at other locations on the device.

16. A method according to claim 11, wherein in addition to the first, second, third and fourth diffraction gratings, fifth and sixth diffraction gratings are provided in the first and second layers respectively, the fifth and sixth diffraction gratings having a different offset to increase the calibration accuracy of the overlay measurement.

17. A method according to claim 11, wherein a further diffraction grating is provided adjacent the other diffraction gratings, either in the first layer or the second layer, the method further comprising measuring the shift for the further diffraction grating to determine a sensor error of the measured shift.

18. A method according to claim 8, wherein the first and second diffraction gratings are provided with a substructure, the substructure of one of the diffraction gratings including a phase jump such that asymmetry arises in the diffracted light as a function of the relative positions of the substructures, the measured asymmetry indicating overlay of the first and second layers.

19. A method according to claim 18, wherein the feature size of the substructure is of the order of a limit of resolution of a lithographic projection apparatus used to project the diffraction gratings onto the device.

20. A method according to claim 18, wherein the feature size of the substructure is sufficiently large relative to the wavelength of the light directed at the diffraction gratings that diffraction from the substructures occurs and propagates between the first layer and the second layer, but the feature size of the substructure is sufficiently small that diffraction from the substructure is not detected during measurement.

21. A method according to claim 18, wherein the first and second diffraction gratings are provided with an overlay offset of a first sign, and third and fourth diffraction gratings having the same substructure are provided, with an overlay offset of an opposite sign, the offsets being used to calibrate the overlay measurement.

22. A method according to claim 21, wherein an additional further diffraction grating is provided adjacent the other diffraction gratings, either in the first layer or the second layer, the method further comprising measuring the shift for the additional diffraction grating to determine a sensor error of the shift.

23. A method according to claim 18, wherein measurements of the substructure are used to reconstruct a substructure shape and thereby relate the shift to overlay.

24. A method according to claim 6, wherein the marker comprises a first diffraction grating provided in a layer of the device, and a second diffraction grating provided in a second layer of the device, the first diffraction grating and the second diffraction grating having different periods each selected to give rise to strong diffraction at different diffraction orders or wavelengths, the asymmetry of the marker being dependent on an overlay of the first and second layers, the measurement comprising measuring the position of the first diffraction grating by measuring one diffraction order or wavelength and measuring the position of the second diffraction grating by measuring the other diffraction order or wavelength, the shift between the measured positions indicating the asymmetry of the marker and the overlay of the first and second layers.

25. A method according to claim 24, wherein the periods of the first and second diffraction gratings are selected such that light diffracted by both diffraction gratings will not yield a strong combined signal having the same frequency as a measured diffraction order.

26. A method according to claim 24, wherein the first and second diffraction gratings are provided one over the other.

27. A method according to claim 24 or claim 25, wherein the first and second diffraction gratings are spatially separated.

28. A method according to claim 27, wherein the first diffraction grating is located adjacent the second diffraction grating as a diffraction grating pair.

29. A method according to claim 28, wherein rotational errors are avoided by providing a second diffraction grating pair, comprising a third diffraction grating having the same period as the; second diffraction grating and a fourth diffraction grating having the same period as the first diffraction grating, the second pair being laterally displaced relative to the first diffraction grating pair, in a direction transverse to lines of the diffraction gratings.

30. A method according to claim 29, wherein one diffraction grating is divided into two rows which lie on either side of the other diffraction grating, the division being along an axis transverse to the direction of lines of the diffraction gratings.

31. A method according to claim 30, wherein both the first diffraction grating and the second diffraction grating are divided into two or more alternating rows.

32. A method according to claim 31, wherein the first diffraction grating and the second diffraction grating have a common axis of symmetry which lies transverse to the direction of lines of the diffraction gratings.

33. A method according to claim 31, wherein the rows are arranged to form a diffraction grating having a period defined by the separation of the rows.

34. A method according to claim 33, wherein the method further comprises monitoring the strength of a beat frequency caused by coupling between light diffracted by the first diffraction grating and light diffracted by the second diffraction grating, to provide an indication of overlay in the direction parallel to the period defined by the separation of the rows.

35. A method according to claim 34, wherein the separation of the rows is selected such that an overlay error arising due to a capture error will give rise to strong coupling.

36. A method according to any of claims 30, wherein an offset is introduced into one of the diffraction gratings relative to the other diffraction grating, the size of the offset being selected to minimize coupling between light diffracted by the first diffraction grating and light diffracted by the second diffraction grating.

37. A method according to claim 24, wherein the method further comprises determining sensor error by providing in the first layer of the device a third diffraction grating having the same period as the second diffraction grating, and providing in the second layer of the device a fourth diffraction grating having the same period as the first diffraction grating, the sensor error being eliminated by comparing the measured shift for the first and second diffraction gratings and the third and fourth diffraction gratings.

38. A method according to claim 6, wherein the marker comprises a diffraction grating arranged to measure the focus accuracy of a lithographic projection apparatus, the method comprising providing on a mask of the lithographic projection apparatus a diffraction grating having a substructure which includes a step in optical path length, the step being of opposite sign for adjacent lines of the diffraction grating, the step being selected such that during projection by the lithographic projection apparatus of the diffraction grating onto the device, a focus error will cause the projected diffraction grating to be displaced, adjacent lines of the projected diffraction grating being displaced in opposite directions, giving rise to an asymmetry which is measured by the shift.

39. A method according to claim 38, wherein the step in optical path length is such that it introduces a phase difference of substantially one quarter of the wavelength of light used to project the diffraction grating onto the device.

40. A method according to claim 38, wherein the relative widths of the adjacent lines of the diffraction grating are selected to be different such that the asymmetry of the projected diffraction grating is sufficiently large to be measured by the shift.

41. A method according to claim 6, wherein the marker comprises a diffraction grating arranged to measure a critical dimension of a lithographic projection apparatus, the method comprising providing on the device a diffraction grating having a substructure with a period at, or of the order of, the limit of resolution of the lithographic projection apparatus, the substructure being arranged to extend lines of the diffraction grating thereby rendering the diffraction grating asymmetric, changes of the critical dimension modifying the effective reflectivity of the substructure thereby modifying the asymmetry of the diffraction grating, the modified asymmetry being measured by the shift.

42. A method according to claim 6, wherein the marker comprises a first diffraction grating and an adjacent second diffraction grating, the first diffraction grating and the second diffraction grating having different periods each selected to give rise to strong diffraction at different diffraction orders, such that a measurement of the position of the first diffraction grating is provided by measuring one diffraction order and a measurement of the position of the second diffraction grating is provided by measuring the other diffraction order, the method comprising processing the first and second diffraction gratings so that the marker includes an asymmetry arising from processing effects, and measuring the shift between the first and second positions to determine the effect of processing on the marker.

43. A method according to claim 42, wherein the processing effect is quantified by comparison of the shift with previously measured shifts determined for known processing asymmetries.

44. A method according to claim 42, wherein the processing is cleared from the second diffraction grating prior to measurement of the positions of the first and second diffraction gratings.

45. A method according to claim 44, wherein the marker further comprises a third diffraction grating and a fourth diffraction grating having periods which correspond to the first and second diffraction gratings respectively, the method further comprising processing the third and fourth diffraction gratings and clearing processing from them, measuring the positions of the third and fourth diffraction gratings to determine the shift between the measured positions and using the determined shift to correct errors in a shift measured for the first and second diffraction gratings.

46. A method according to claim 24, wherein the first and second diffraction gratings are used to measure processing asymmetry by processing the first and second diffraction gratings so that the marker includes an asymmetry arising from processing effects, and measuring the shift between the first and second positions to determine the effect of processing on the marker.

47. A method according to claim 24, wherein prior to the overlay measurement the first diffraction grating is used to determine an aligned position for projection onto the device of an image including the second diffraction grating.

48. A method according to claim 47, wherein following the overlay measurement the second diffraction grating is used to determine an aligned position for projection onto the device of a subsequent image.

49. A method according to claim 47, wherein the projected image includes an additional diffraction grating having a different period from the second diffraction grating, the method further comprising using the additional diffraction grating to determine an aligned position for projection onto the device of a subsequent image.

50. A method according to claim 1, wherein the inspection method is performed directly after exposure of the marker on the device.

51. A method according to claim 1, wherein the inspection method is performed after exposure and post exposure bake of the marker on the device.

52. A method according to claim 1, wherein the inspection method is performed after exposure and hard bake of the marker on the device.

53. A method according to claim 1, wherein the inspection method is performed after exposure and processing of the marker on the device.

54. A method according to claim 1, wherein the inspection method is performed after application of a layer of resist onto the device and before exposure of that resist, the marker being provided in one or more processed layers of the device.

55. A method according to claim 1, wherein the method is performed for a device located within a lithographic projection apparatus, the position of the marker being used to provide alignment information for lithographic projection in addition to providing inspection of the device.

56. A device inspection apparatus, the apparatus comprising: a light source arranged to direct light at an asymmetric marker provided on a device; a detector arranged to detect light diffracted from the marker with a particular wavelength or diffraction angle thereby providing a measurement of the position of the marker, a second detector arranged to detect light diffracted from the marker with a different wavelength or angle order thereby providing a second measurement of the position of the marker; and a metrology unit configured to compare the measured positions to determine a shift indicative of the degree of asymmetry of the marker.

57. A device inspection apparatus according to claim 56, wherein the apparatus is located within a lithographic projection apparatus.

58. A device inspection apparatus according to claim 56, wherein the apparatus is located within a track connected to a projection apparatus.

59. A device inspection apparatus according to claim 56, wherein the apparatus is provided in a housing which is separated from the lithographic projection apparatus.

60. A method of device inspection, the method comprising: providing on a device to be inspected an asymmetric marker comprising a first diffraction grating in a first layer of the device, and a second diffraction grating in a second layer of the device, the first diffraction grating and the second diffraction grating having the same period and being provided one over the other such that the light is diffracted by both of the diffraction gratings in combination, the asymmetry of the marker being dependent upon the overlay of the first and second layers; directing light at the marker, obtaining a first measurement of the position of the marker via detection of diffracted light of a particular wavelength or diffraction angle; obtaining a second measurement of the position of the marker via detection of diffracted light of a different wavelength or diffraction angle; and comparing the first and second measured positions to determine a shift indicative of the degree of asymmetry of the marker.

61. A method of device inspection, the method comprising: providing on a device to be inspected an asymmetric marker comprising a first diffraction grating in a first layer of the device, and a second diffraction grating in a second layer of the device, the first diffraction grating and the second diffraction grating having different periods each selected to give rise to strong diffraction at different diffraction orders or at different wavelengths, the asymmetry of the marker being dependant on an overlay of the first and second layers; directing light at the marker; obtaining a first measurement of the position of the marker via detection of diffracted light of a particular wavelength or diffraction order; obtaining a second measurement of tree position of the marker via detection of diffracted light of a different wavelength or diffraction order; and comparing the first and second measured positions to determine a shift indicative of the degree of asymmetry of the marker and the overlay of the first and second layers.

62. A method of device inspection to measure the focus accuracy of a lithographic projection apparatus, the method comprising: providing on a mask of the lithographic projection apparatus a diffraction grating having a substructure which includes a step in optical path length, the step being of opposite sign for adjacent lines of the diffraction grating; using the lithographic projection apparatus to project the diffraction grating onto the device, adjacent lines of the projected diffraction grating being displaced in opposite directions to form an asymmetric marker due to the step; obtaining a first measurement of the position of the marker via detection of diffracted light of a particular wavelength or diffraction angle; obtaining a second measurement of the position of the marker via detection of diffracted light of a different wavelength or diffraction angle; and comparing the first and second measured positions to determine a shift indicative of the degree of asymmetry of the marker and of the focus error.

63. A method of device inspection to measure a critical dimension of a lithographic projection apparatus, the method comprising: providing on a device to be inspected an asymmetric marker comprising a diffraction grating having a substructure with a period at, or of the order of, the limit of resolution of the lithographic projection apparatus, the substructure being arranged to extend lines of the diffraction grating thereby rendering the diffraction grating asymmetric, changes of the critical dimension modifying the effective reflectivity of the substructure thereby modifying the asymmetry of the diffraction grating; directing light at the marker; obtaining a first measurement of the position of the marker via detection of diffracted light of a particular wavelength or diffraction angle; obtaining a second measurement of the position of the marker via detection of diffracted light of a different wavelength or diffraction angle; and comparing the first and second measured positions to determine a shift indicative of the degree of asymmetry of the marker and of the critical dimension of the lithographic projection apparatus.

64. A method of device inspection, the method comprising: providing on a device to be inspected an asymmetric marker comprising a first diffraction grating in a first layer of the device, and a second diffraction grating in a second layer of the device, the first diffraction grating and the second diffraction grating having different periods each selected to give rise to strong diffraction at different diffraction orders or at different wavelengths, the asymmetry of the marker being dependant on the overlay of the first and second layers; processing the first and second diffraction gratings so that the marker includes an asymmetry arising from processing effects; directing light at the marker, obtaining a first measurement of the position of the marker via detection of diffracted light of a particular wavelength or diffraction order; obtaining a second measurement of the position of the marker via detection of diffracted light of a different wavelength or diffraction order, and comparing the first and second measured positions to determine a shift indicative of the degree of asymmetry of the marker and the effect of processing on the marker.

* * * * *